(12) United States Patent  
Satoh et al.

(10) Patent No.: US 8,847,706 B2  
(45) Date of Patent: Sep. 30, 2014

(54) MULTIBAND RESONATOR AND MULTIBAND-PASS FILTER

(75) Inventors: Kei Satoh, Yokosuka (JP); Shoichi Narahashi, Yokohama (JP); Yuta Takagi, Yokosuka (JP)

(73) Assignee: NTT DoCoMo, Inc., Tokyo (JP)

( * ) Notice: Subject to any disclaimer, the term of this patent is extended or adjusted under 35 U.S.C. 154(b) by 601 days.

(21) Appl. No.: 13/166,089

(22) Filed: Jun. 22, 2011

(65) Prior Publication Data

US 2011/0316652 A1 Dec. 29, 2011

(30) Foreign Application Priority Data

Jun. 29, 2010 (JP) .................................. 2010-147292  
Apr. 19, 2011 (JP) .................................. 2011-093025

(51) Int. Cl.  
*H03H 7/01* (2006.01)  
*H01P 1/213* (2006.01)  
*H01P 1/203* (2006.01)

(52) U.S. Cl.  
CPC ........... *H03H 7/0115* (2013.01); *H01P 1/2135* (2013.01); *H01P 1/20345* (2013.01); *H03H 7/1766* (2013.01)  
USPC .......................................... 333/185; 333/175

(58) Field of Classification Search  
CPC ............................ H03H 7/0115; H03H 7/1766  
USPC .......................................... 333/175, 185, 168  
See application file for complete search history.

(56) References Cited

U.S. PATENT DOCUMENTS

| | | | | |
|---|---|---|---|---|
| 5,917,387 A | * | 6/1999 | Rice et al. | ...................... 333/174 |
| 2003/0048156 A1 | * | 3/2003 | Uriu et al. | ....................... 333/175 |
| 2006/0267707 A1 | | 11/2006 | Tang et al. | |
| 2009/0115555 A1 | | 5/2009 | Kim et al. | |
| 2009/0212886 A1 | | 8/2009 | Satoh et al. | |

FOREIGN PATENT DOCUMENTS

| | | |
|---|---|---|
| JP | 2009-225436 A | 10/2009 |
| JP | 2010-34634 | 2/2010 |

OTHER PUBLICATIONS

Extended European Search Report issued Nov. 25, 2011, in Patent Application No. 11171716.1.

Masaya Tamura, et al., "Novel Vertical Split Ring Resonator Fabricated in LTCC", Korea-Japan Microwave Conference, XP 031190238, Nov. 1, 2007, pp. 105-108.

(Continued)

*Primary Examiner* — Benny Lee  
*Assistant Examiner* — Gerald Stevens  
(74) *Attorney, Agent, or Firm* — Oblon, Spivak, McClelland, Maier & Neustadt, L.L.P.

(57) ABSTRACT

An multiband resonator of the present invention includes a dielectric substrate including three or more dielectric layers, a ground conductor, a main-line conductor, a sub-line conductor, a sub open stub, a main open stub, a short-circuit conductor, a main through conductor, and a sub through conductor. The short-circuit conductor electrically connects one end of the main-line conductor to one end of the sub-line conductor and to the ground conductor. The main through conductor electrically connects the other end of the main-line conductor to one end of the main open stub that is aligned with that other end of the main-line conductor. The sub through conductor electrically connects the other end of the sub-line conductor to one end of the sub open stub that is aligned with that other end of the sub-line conductor.

4 Claims, 31 Drawing Sheets

(56) References Cited

OTHER PUBLICATIONS

Masaya Tamura, et al., "Design and Analysis of Vertical Split Ring Resonator and Its Application to Unbalanced-Balanced Filter", IEEE Transactions on Microwave Theory and Techniques, vol. 58, No. 1, XP 011298510, Jan. 1, 2010, pp. 157-164.

Shoichi Kitazawa et al., "A Multilayer Single-Input/Single Output Dual-Band Filter Fabricated in a High Permittivity LTCC Substrate", IEICE Trans. Electron., vol. E89-C, No. 4, Apr. 2006, pp. 509-516.

Kentaro Yoshida et al., "Study on Characteristics of Folded Comb-Line Filter", Journal of the Institute of Electronics, Information and Communication Engineers, C vol. J86-C, No. 4, Apr. 2003, pp. 442-449 (with an English Translation).

Toshiaki Kitamura et al., "Proposal of a new Folded Comb-Line Filter", IEEE Microwave and Wireless Components Letters, vol. 13, No. 8, Aug. 2003, pp. 357-359.

Combined Chinese Office Action and Search Report issued Nov. 1, 2013 in Chinese Patent Application No. 201110178339.7 (with English language translation).

Office Action issued Dec. 3, 2012 in European Patent Application No. 11 171 716.1.

* cited by examiner

MULTIBAND RESONATOR AND MULTIBAND-PASS FILTER

TECHNICAL FIELD

The present invention relates to a multiband resonator having multiple resonance frequency bands and a multiband-pass filter using such a multiband resonator and, in particular, to a multiband resonator and a multiband-pass filter used for sending and receiving signals in mobile communication, satellite communication, fixed microwave communication and other communication technology fields.

BACKGROUND ART

A multiband resonator having multiple resonance frequency bands described in Non-Patent Literature 1 (S. Kitazawa, H. Miyake, M. Geshiro, and M. Ohashi, "A Multilayer Single-Input/Single-Output Dual-Band Filter Fabricated in a High Permittivity LTCC Substrate", IEICE Transactions on Electronics, Vol. E89-C, No. 4, pp. 509-516, April 2006) is known as the conventional art. The multiband resonator has a structure in which two resonators, each having one resonance frequency band that differs from the other, are stacked with a shield layer between them. The resonators are coupled to input and output ports to form a multiband resonator. A wide variety of resonators with single resonance frequency band have been disclosed, such as the one described in Non-Patent Literature 2 (Kentaro Yoshida, Toshiaki Kitamura, Masahiro Geshiro, and Toshio Ishizaki, "Study on Characteristics of Folded Comb-Line Filter", IEICE Transactions C, Vol. J86-C, No. 4, pp. 442-449, April 2003).

In the conventional art, resonators having different resonance frequency bands are stacked with a shield between them, in order to provide multiple resonance frequency bands. That is, independent resonators are combined together in such a manner that the resonators do not affect each other. Accordingly, such multiband resonators require many layers and therefore are difficult to reduce in size.

An object of the present invention is to reduce the size of a multiband resonator having multiple resonance frequency bands.

SUMMARY OF THE INVENTION

A multiband resonator of the present invention comprises a dielectric substrate, a ground conductor, a main-line conductor, a sub-line conductor, a sub open stub, a main open stub, a short-circuit conductor, a main through conductor, and a sub through conductor. The dielectric substrate comprises three or more dielectric layers. The ground conductor may be formed on any of the dielectric layers or may be formed so as to cover the entire dielectric substrate. The main-line conductor and the sub-line conductor are formed on any of the dielectric layers. The sub open stub is formed on a dielectric layer on which neither of the main-line conductor and the sub-line conductor is formed. The main open stub is formed on a dielectric layer on which none of the main-line conductor, the sub-line conductor and the sub open stub is formed. The short-circuit conductor electrically connects one end of the main-line conductor to one end of the sub-line conductor and to the ground conductor. The main through conductor electrically connects the other end of the main-line conductor to one end of the main open stub that is aligned with that other end of the main-line conductor. The sub through conductor electrically connects the other end of the sub-line conductor to one end of the sub open stub that aligned with that other end of the sub-line conductor.

The main-line conductor and sub-line conductor may be formed on different dielectric layers or the same dielectric layer. If the main-line conductor and the sub-line conductor are formed on different dielectric layers, the dielectric substrate includes at least first to fourth dielectric layers, and a master through conductor may be used as the short-circuit conductor. The master through conductor passes through a number of dielectric layers and electrically connects one end of the main-line conductor to one end of the sub-line conductor that is aligned with the one end of the main-line conductor and also electrically connects the one end of the main-line conductor to the ground conductor. If the main-line conductor and the sub-line conductor are formed on the same dielectric layer, the dielectric substrate includes at least first to third dielectric layers, and a first short-circuit line conductor may be used as the short-circuit conductor. The first short-circuit conductor is formed on the dielectric layer on which the main-line conductor and the sub-line conductor are formed and electrically connects one end of the main-line conductor to one end of the sub-line conductor and to the ground conductor.

The term "aligned" as used herein means that the ends practically coincide with each other when viewed in the direction normal to the plane of the dielectric substrate (that is, when viewed from above the plane). A multiband-pass filter of the present invention comprises multiple multiband resonators of the present invention as resonance parts and also includes an input-output line conductor for input and an input-output line conductor for output.

EFFECTS OF THE INVENTION

The multiband resonator of the present invention is small in size because resonators having different resonance frequency bands are (integrally) combined together in such a manner that the resonators share components. Furthermore, the multiband-pass filter of the present invention is small in size because the multiband-pass filter uses such a multiband resonator of the present invention.

DETAILED DESCRIPTION OF THE EMBODIMENTS

Figure 1:
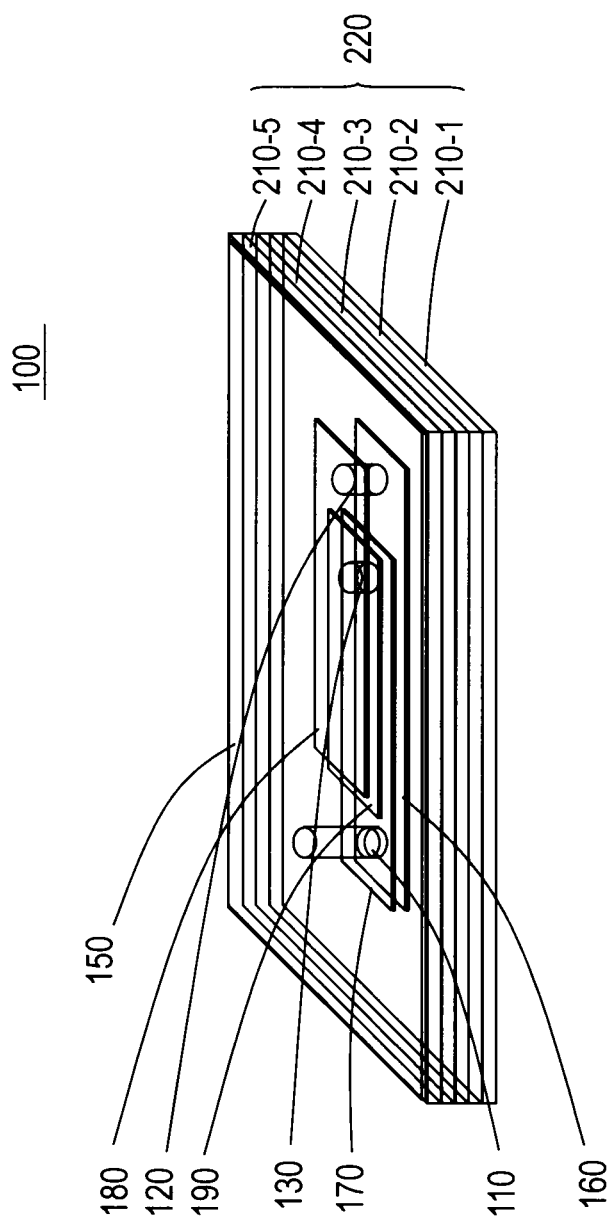
FIG. 1 is a perspective view illustrating an exemplary configuration of a multiband resonator of a first embodiment.

Embodiments of the present invention will be described below in detail. Like components having like functions are given like reference numerals and repeated description of such components will be omitted.

First Embodiment

Figure 2:
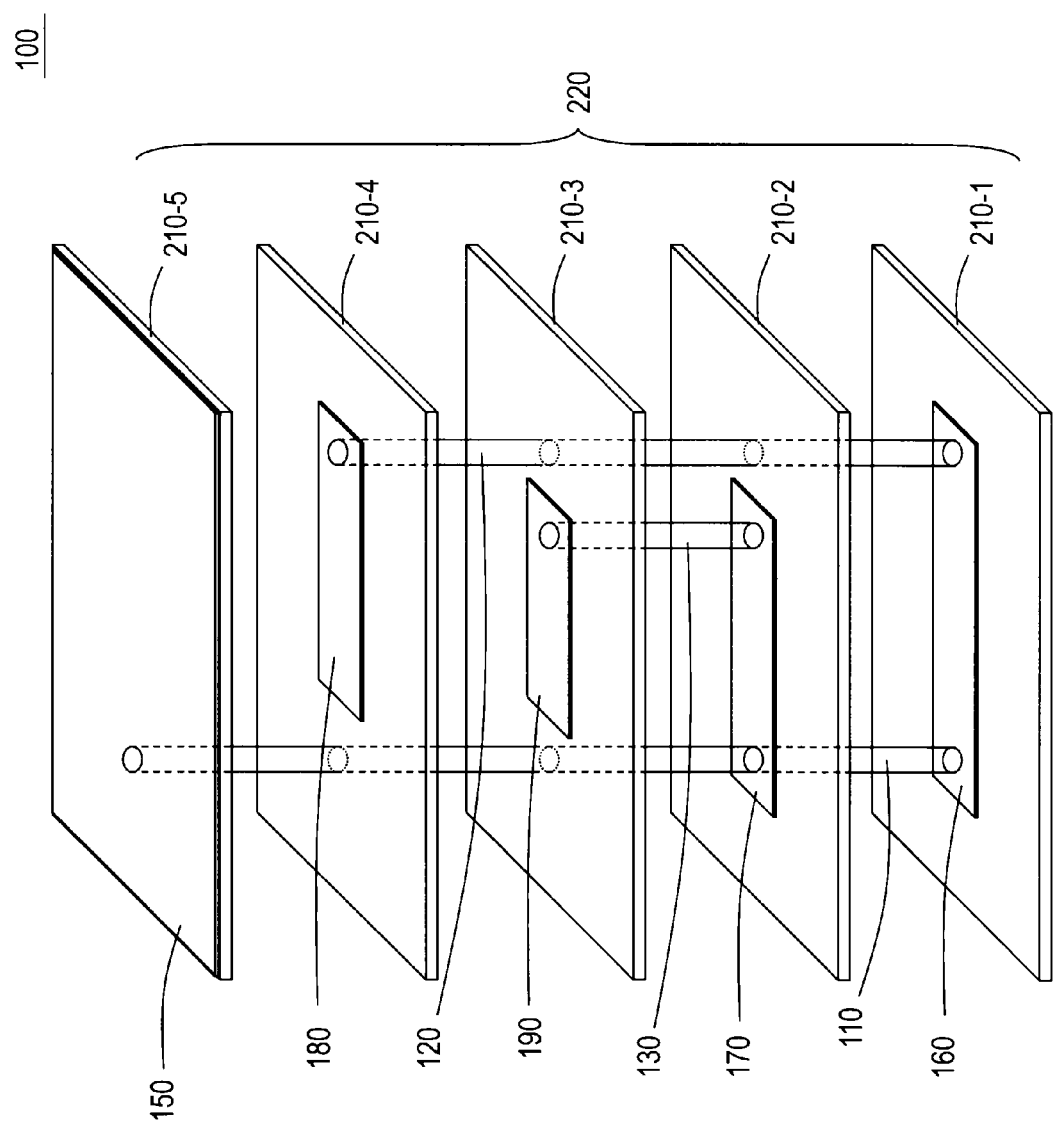
FIG. 2 is an exploded perspective view of the multiband resonator according to the first embodiment.
Figure 3:
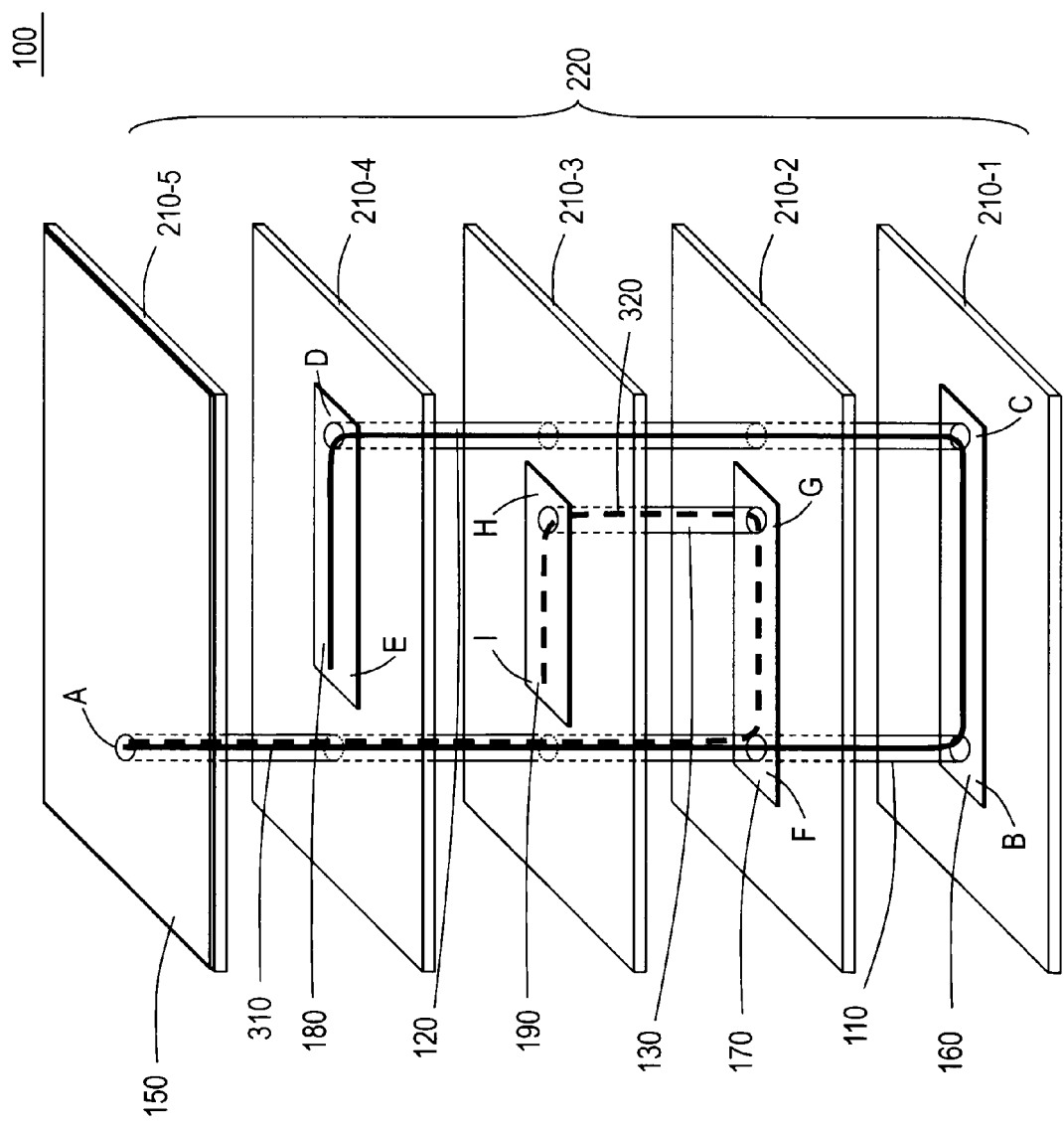
FIG. 3 is an exploded perspective view for explaining a principle of operation of the present invention.

FIG. 1 is a perspective view illustrating an exemplary configuration of a multiband resonator of a first embodiment. FIG. 2 is an exploded perspective view of the multiband resonator of the first embodiment. It should be noted that while in these figures the components are depicted as being transparent so that every component can be seen, the components do not need to be transparent and that in many cases the components are made of opaque materials. Furthermore, while a master through conductor 110, a main through conductor 120, and a sub through conductor 130 are elongated in the exploded perspective view in FIG. 2 since dielectric layers are depicted as being separated, they have a length equal to the thickness of one or more dielectric layers in reality as illustrated in FIG. 1. FIG. 3 is an exploded perspective view for explaining a principle of operation of the present invention. While input-output lines are omitted from the figures, input-output lines may be formed on the same surface on which a main-line conductor is formed, for example.

The multiband resonator 100 comprises a dielectric substrate 220 comprising first to fifth dielectric layers 210-1, . . . , 210-5, a main-line conductor 160 formed on the first dielectric layer 210-1, a sub-line conductor 170 formed on the second dielectric layer 210-2, a sub open stub 190 formed on the third dielectric layer 210-3, a main open stub 180 formed on the fourth dielectric layer 210-4, a ground conductor 150 formed on the fifth dielectric layer 210-5, a master through conductor 110, a main through conductor 120, and a sub through conductor 130. The master through conductor 110 electrically connects one end B of the main-line conductor 160 to one end F of the sub-line conductor 170 that is aligned with the one end B of the main-line conductor 160, and to the ground conductor 150. The main through conductor 120 electrically connects the other end C of the main-line conductor 160 to one end D of the main open stub 180 that is aligned with the other end C of the main-line conductor 160. The sub through conductor 130 electrically connects the other end G of the sub-line conductor 170 to one end H of the sub open stub 190 that is aligned with the other end G of the sub-line conductor 170. The term "aligned" as used herein means that the ends practically coincide with each other when the dielectric substrate 220 is viewed in the direction normal to the plane of the dielectric substrate 220 (that is, when viewed from above the plane).

The thick solid line in FIG. 3 indicates a location where a first resonance mode 310 is formed. The first resonance mode can be considered as resonance in which the electrical length from point A (short-circuit point) that is in contact with the ground conductor 150 to the open end E of the main open stub 180 (A-F-B-C-D-E) is approximately equal to a ¼ wavelength. The dashed line in FIG. 3 indicates a location where a second resonance mode 320 is formed. The second resonance mode can be considered as resonance in which the electrical length from point A (short-circuit point) that is in contact with the ground conductor 150 to the open end I of the sub open stub 190 (A-F-G-H-I) is approximately equal to a ¼ wavelength.

Because of the configuration and principle described above, the multiband resonator 100 having multiple resonance frequency bands can be (integrally) formed through sharing of components. Thus, a multiband resonator 100 of small size can be fabricated. Furthermore, the resonance frequency bands (or passbands if a multiband-pass filter is fabricated with the multiband resonator) can be adjusted by changing the thickness and permittivity of the dielectric layers and the length of the main-line conductor 160 and the main open stub 180, and the length of the sub-line conductor 170 and the sub open stub 190. The first to fifth dielectric layers are stacked in this order in FIGS. 1 to 3. However, the order is not limited to this and may be designed as appropriate for adjustment. The other end E of the main open stub 180 and the other end I of the sub open stub 190 are aligned with each other in FIGS. 1 to 3. However, they do not necessarily need to be aligned with each other and may be designed as appropriate for adjustment. Furthermore, an LC parallel resonance circuit may be provided between the other end C of the main-line conductor 160 and the ground conductor 150. The LC parallel resonance circuit may be a lumped-parameter element. The LC parallel resonance circuit serves as a substitute for the master through conductor. If the LC parallel resonance circuit is considered to be resonance means, the LC parallel resonance circuit affects resonance frequency bands. If input-output lines are provided and the LC parallel resonance circuit is considered to be filtering means, the LC parallel resonance circuit also affects input-output matching. A multiband-pass filter can be fabricated by providing multiple multiband resonators 100 as resonance parts and providing input-output line conductors connected to the main-line conductors in any two of the resonators.

[First Variation]

Figure 4:
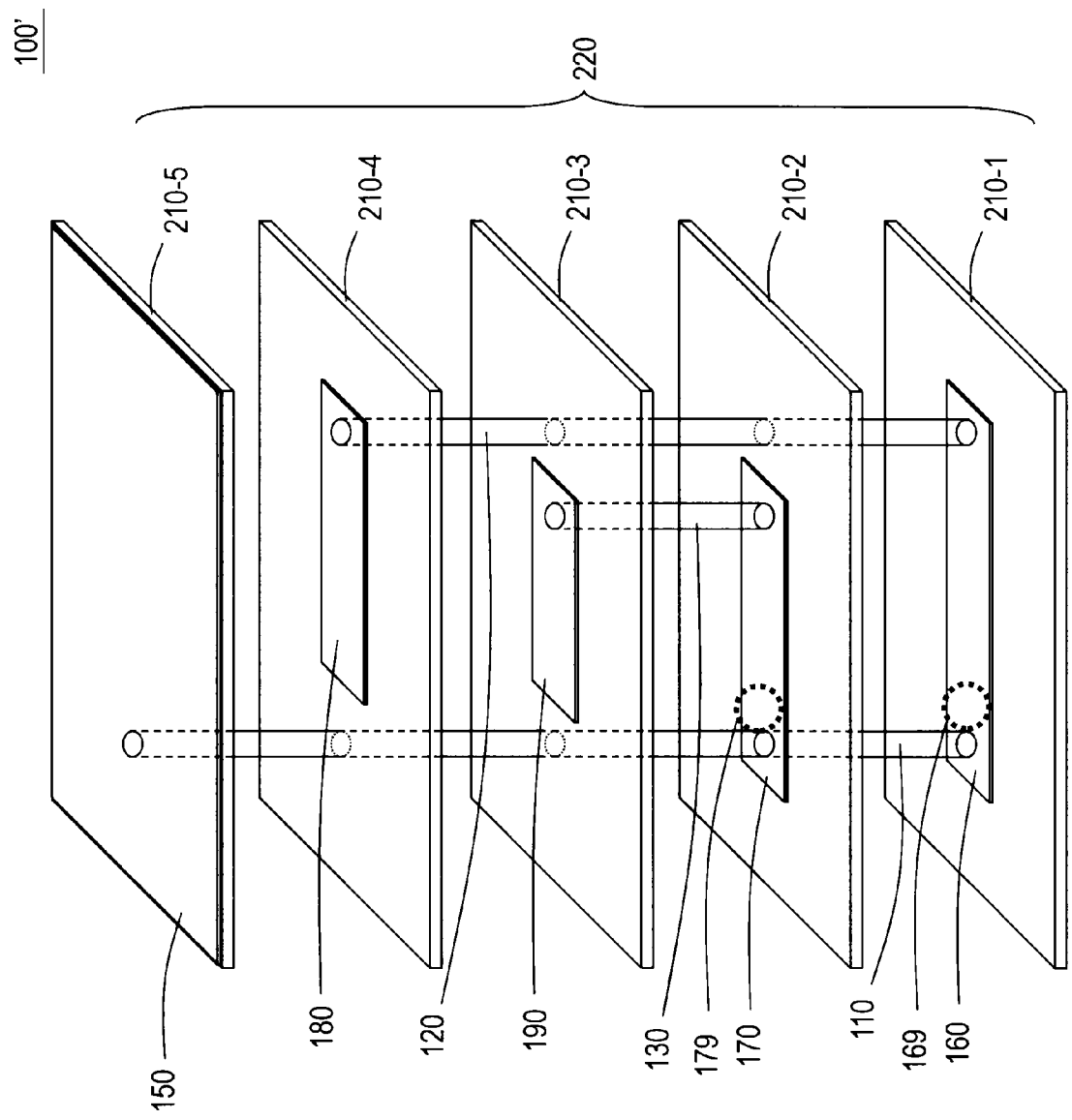
FIG. 4 is an exploded perspective view of a multiband resonator of a first variation of the first embodiment.

FIG. 4 is an exploded perspective view of a multiband resonator of a first variation of the first embodiment. The components are depicted as being transparent in FIG. 4 so that every component can be seen.

Furthermore, while a master through conductor 110, a main through conductor 120, and a sub through conductor 130 are elongated in the exploded perspective view in FIG. 4 since dielectric layers are depicted as being separated, they have a length equal to the thickness of one or more dielectric layers in reality as illustrated in FIG. 1. While input-output lines are omitted from the figures, input-output lines may be formed on the same surface on which a main-line conductor is formed, for example.

The multiband resonator 100' further includes a main switch 169 and a sub switch 179 in addition to the components of the multiband resonator 100. The main switch 169 is provided at the one end of a main-line conductor 160 and electrically turns on (connects) and off (disconnects) the connection between the main-line conductor 160 and the master through conductor 110. The sub switch 179 is provided at the one end of a sub-line conductor 170 and electrically turns on (connects) and off (disconnects) the connection between the sub-line conductor 170 and the master through conductor 110. When both of the main switch 169 and the sub switch 179 are on, the multiband resonator 100' functions as a multiband resonator having two resonance frequency bands like the multiband resonator 100. When the main switch 169 is on and the sub switch 179 is off, the multiband resonator 100' functions as a resonator that has only a band of resonance frequencies caused by the first resonance mode. When the main switch is off and the sub switch is on, the multiband resonator 100' functions as a resonator that has only a band of resonance frequencies caused by the second resonance mode.

Because of the configuration described above, the multiband resonator of the first variation is capable of functioning as both a multiband resonator and a resonance-band-selective resonator, and can be fabricated in small size. Furthermore, a multiband-pass filter can be fabricated by providing multiple multiband resonators 100' as resonance parts and providing input-output line conductors connected to main-line conductors in any two of the resonance parts.

[Second Variation]

Figure 5:
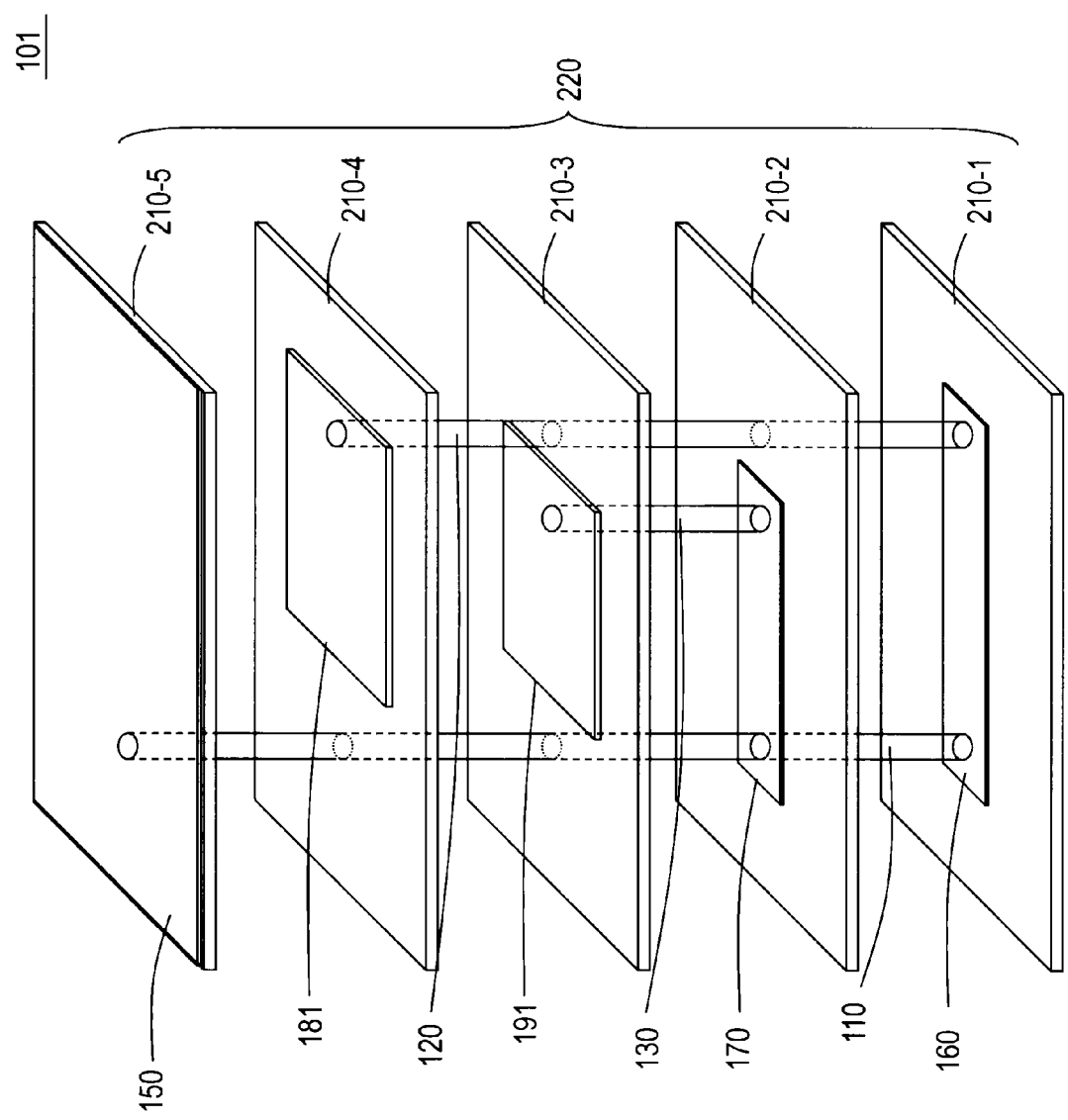
FIG. 5 is an exploded perspective view of a multiband resonator of a second variation of the first embodiment.

FIG. 5 is an exploded perspective view of a multiband resonator of a second variation of the first embodiment. The components are depicted as being transparent so that every component can be seen in FIG. 5. Furthermore, while a master through conductor 110, a main through conductor 120, and a sub through conductor 130 are elongated in the exploded perspective view since dielectric layers are depicted as being separated, they have a length equal to the thickness of one or more dielectric layers in reality as illustrated in FIG. 1. While input-output lines are omitted from the figures, input-output lines may be formed on the same surface on which a main-line conductor is formed, for example.

The multiband resonator 101 differs from the multiband resonator 100 in that the main open stub 181 is wider than the main-line conductor 160 and the sub open stub 191 is wider than the sub-line conductor 170. The rest of the configuration of the multiband resonator 101 is the same as that of the multiband resonator 100.

Because of the configuration described above, the resonance frequency bands of the multiband resonator of the second variation can be adjusted also by appropriately choosing the widths of the main open stub 181 and the sub open stub 191. Accordingly, in addition to size reduction, the multiband resonator achieves the ease of adjustment of resonance frequency bands. The second variation can be combined with the first variation. Furthermore, a multiband-pass filter can be fabricated by providing multiple multiband resonators 101 as resonance parts and providing input-output line conductors connected to main-line conductors in any two of the resonance parts.

[Third Variation]

Figure 6:
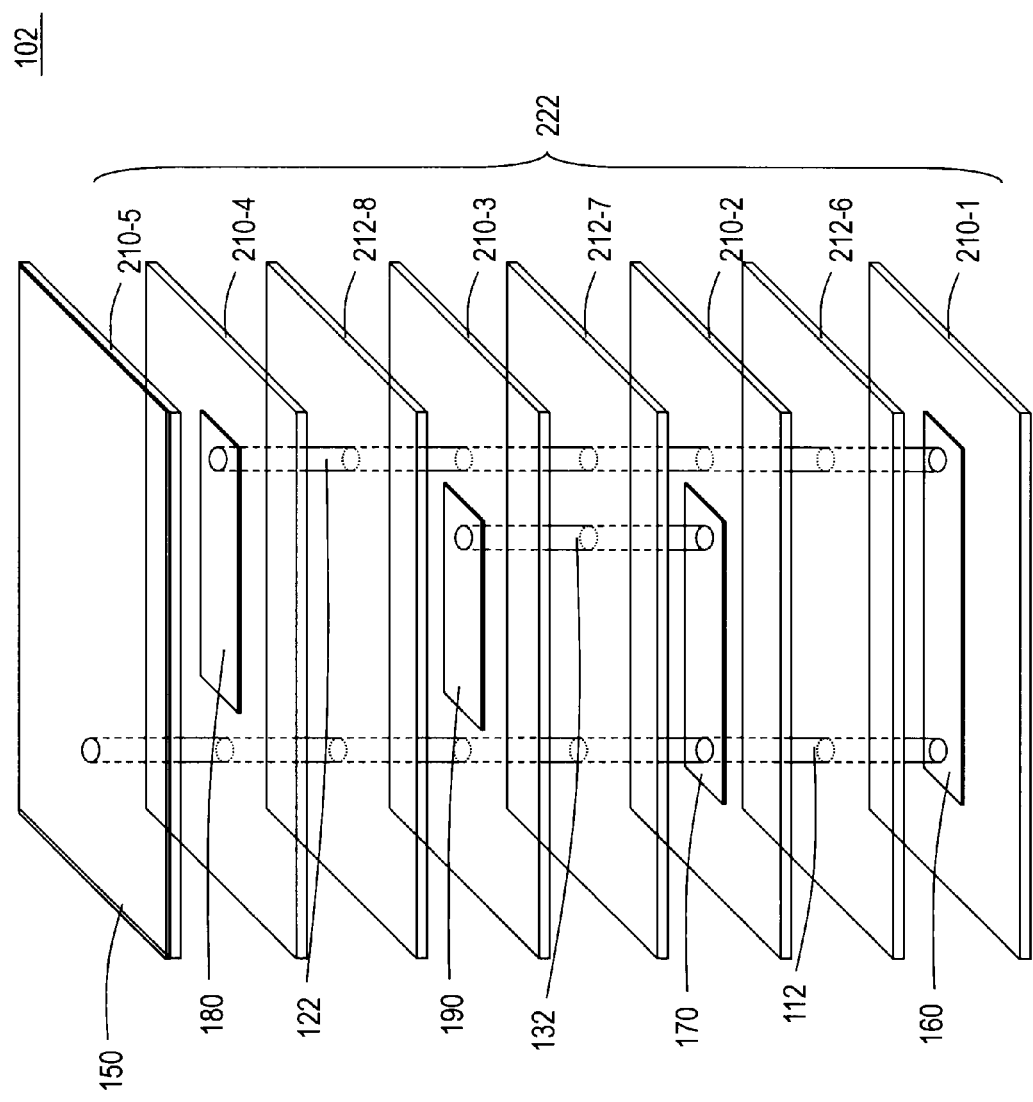
FIG. 6 is an exploded perspective view of a multiband resonator of a third variation of the first embodiment.

FIG. 6 is an exploded perspective view of a multiband resonator of a third variation of the first embodiment. The components are depicted as being transparent so that every component can be seen in FIG. 6. Furthermore, while a master through conductor 112, a main through conductor 122, and a sub through conductor 132 are elongated in the exploded perspective view since dielectric layers are depicted as being separated, they have a length equal to the thickness of one or more dielectric layers in reality as illustrated in FIG. 1. While input-output lines are omitted from the figures, input-output lines may be formed on the same surface on which a main-line conductor is formed, for example.

The multiband resonator 102 differs from the multiband resonator 100 in that a dielectric layer 212-6 is provided between dielectric layers 210-1 and 210-2 of the dielectric substrate 222, a dielectric layer 212-7 is provided between dielectric layers 210-2 and 210-3, and a dielectric layer 212-8 is provided between dielectric layers 210-3 and 210-4. The rest of the configuration of the multiband resonator 102 is the same as that of the multiband resonator 100.

With the configuration described above, the size of the multiband resonator can be reduced and the amount of electromagnetic coupling between the main-line conductor and the sub-line conductor and the amount of electromagnetic coupling between the main open stub and the sub open stub can be readily adjusted and therefore the resonance frequency bands and unloaded Q of the multiband resonator can be easily adjusted. The variation can be combined with any of the first and second variations. Furthermore, a multiband-pass filter can be fabricated by providing multiple multiband resonators 102 as resonance parts and providing input-output line conductors connected to main-line conductors in any two of the resonance parts.

[Fourth Variation]

Figure 7:
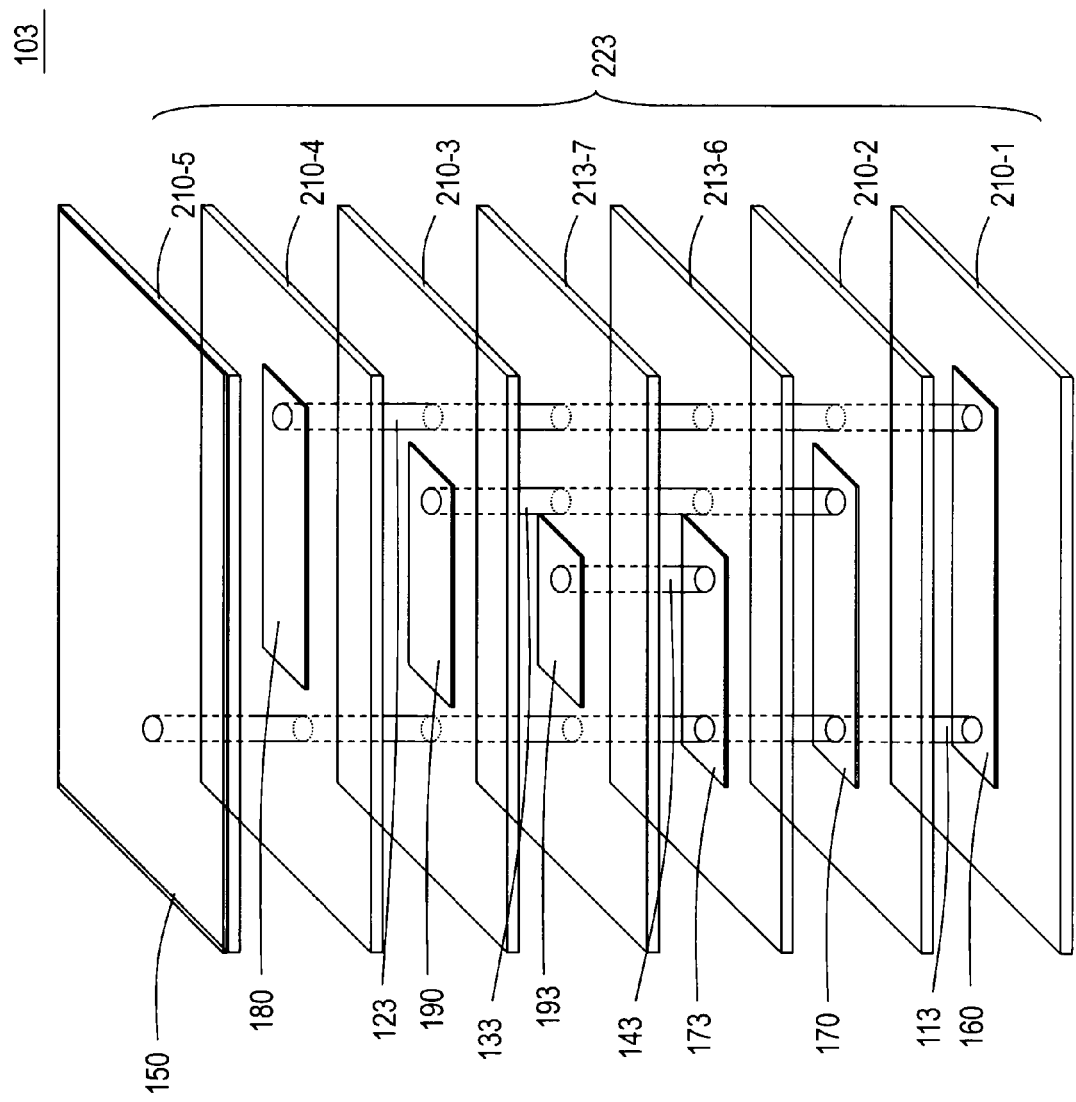
FIG. 7 is an exploded perspective view of a multiband resonator of a fourth variation of the first embodiment.

FIG. 7 is an exploded perspective view of a multiband resonator of a fourth variation of the first embodiment. The components are depicted as being transparent so that every component can be seen in FIG. 7. Furthermore, while a master through conductor 113, a main through conductor 123, a sub through conductor 133, and a second sub through conductor 143 are elongated in the exploded perspective view since dielectric layers are depicted as being separated, they have a length equal to the thickness of one or more dielectric layers in reality as illustrated in FIG. 1. While input-output lines are omitted from the figures, input-output lines may be formed on the same surface on which a main-line conductor is formed, for example.

In the multiband resonator 103, dielectric layers 213-6 and 213-7 are provided between dielectric layers 210-2 and 210-3 of a dielectric substrate 223. A second sub-line conductor 173 is formed on the dielectric layer 213-6 and a second sub open stub 193 is formed on the dielectric layer 213-7. Further provided is a second sub through conductor 143 which electrically connects one end of the second sub-line conductor 173 to one end of the second sub open stub 193 that is aligned with the one end of the second sub-line conductor 173. The master through conductor 113 electrically connects the other end of the second sub-line conductor 173 that is aligned with the one end of the main-line conductor 160 to the one end of the main-line conductor 160. The sub-line conductor 170, the sub open stub 190 and the sub through conductor 133 are sometimes also referred to as the first sub-line conductor 170, the first sub open stub 190 and the first sub through conductor 133, respectively, in order to avoid confusion with the second sub-line conductor 173, the second sub open stub 193, and the second sub through conductor 143, respectively.

Because of the configuration described above, the multiband resonator of the fourth variation can have three resonance frequency bands and can be reduced in size. The resonance frequency bands can be adjusted by changing the thickness or permittivity of the dielectric layers, or the length or width of the line conductors, as in the other variations. The fourth variation can be combined with any of the first to third variations. Furthermore, a multiband resonator having four or more resonance modes can be configured by adding more dielectric layers and adding more sub-line conductors, sub open stubs and sub through conductors. Moreover, a multiband-pass filter can be fabricated by providing multiple such multiband resonators 103 as resonance parts and providing input-output line conductors connected to main-line conductors is provided in any two of the resonance parts.

[Fifth Variation]

Figure 8:
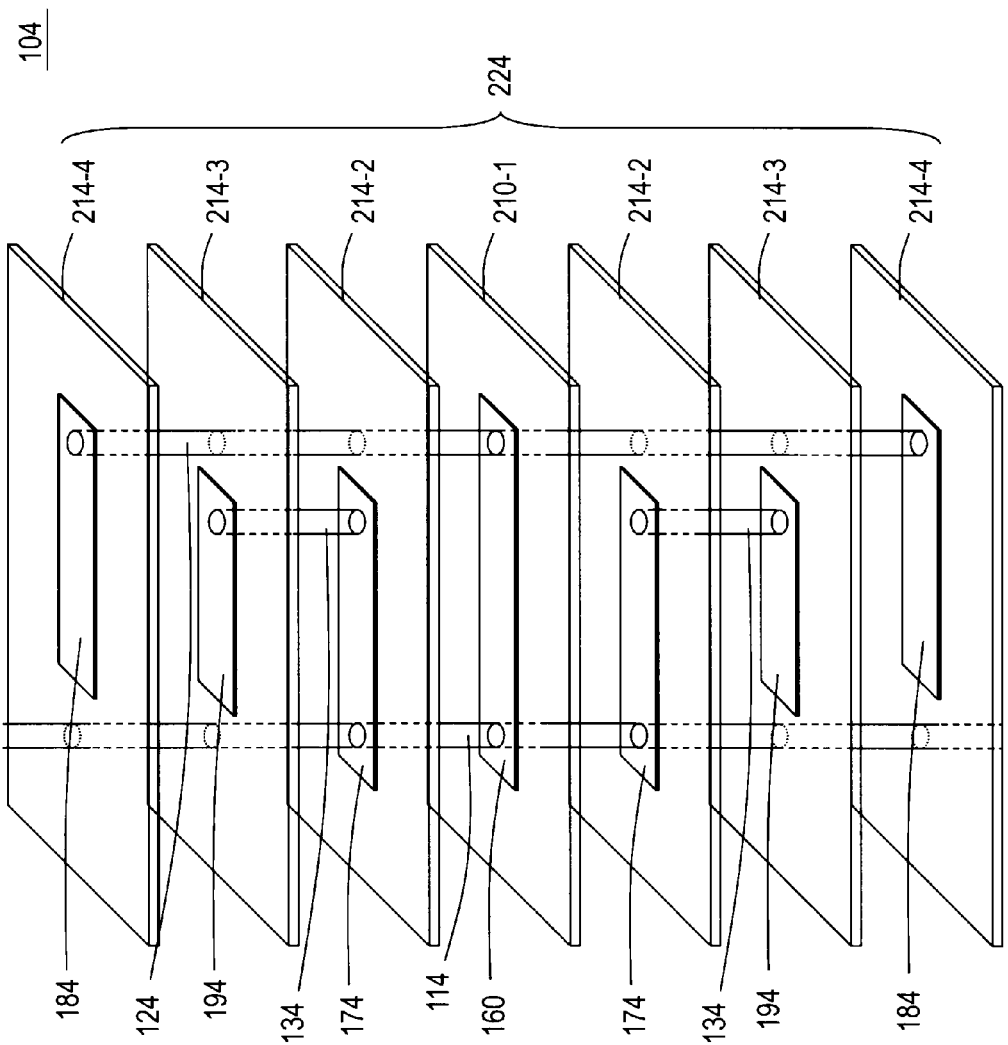
FIG. 8 is an exploded perspective view of a multiband resonator of a fifth variation of the first embodiment.

FIG. 8 is an exploded perspective view of a multiband resonator of a fifth variation of the first embodiment. The components are depicted as being transparent so that every component can be seen in FIG. 8. Furthermore, while a master through conductor 114, a main through conductor 124, and sub through conductors 134 are elongated in the exploded perspective view since dielectric layers are depicted as being separated, they have a length equal to the thickness of one or more dielectric layers in reality as illustrated in FIG. 1. While input-output lines are omitted from the figures, input-output lines may be formed on the same surface on which a main-line conductor 160 is formed, for example. Ground conductors are omitted from FIG. 8. Two ground conductors may be provided on additional required dielectric layer symmetrically with respect to the plane on which the main-line conductor 160 is formed.

The multiband resonator 104 differs from the multiband resonator 100 in that a pair of sub-line conductors 174, a pair of sub open stubs 194 and a pair of main open stubs 184 are formed so that each pair is located symmetrically with respect to the plane on which the main-line conductor 160 is formed. Specifically, a dielectric substrate 224 includes dielectric layers 214-4, 214-3, 214-2, 210-1, 214-2, 214-3, and 214-4 stacked in this order, with the dielectric layer 210-1 at the center. Each of the two sub-line conductors 174 is formed on each of the dielectric layers 214-2, each of the two sub open stubs 194 is formed on each of the dielectric layers 214-3, and each of the two main open stubs 184 is formed on each of the dielectric layers 214-4.

The master through conductor 114 electrically connects one end of the main-line conductor 160 to one end of the sub-line conductor 174 that is aligned with the one end of the main-line conductor 160, and to a ground conductor. The main through conductor 124 electrically connects the other end of the main-line conductor 160 to one end of the main open stub 184 that is aligned with that other end of the main-line conductor 160. The sub through conductor 134 electrically connects the other end of the sub-line conductor 174 to one end of the sub open stub 194 that is aligned with that other end of the sub-line conductor 174. As stated earlier, the term "aligned" as used herein means that the ends practically coincide with each other when the dielectric substrate 224 is viewed in the direction normal to the plane of the dielectric substrate 224 (that is, when viewed from above the plane).

The principle of operation of the multiband resonator of the fifth variation is the same as that described in the First Embodiment section. In addition, the symmetrical disposition of the pair of sub-line conductors 174, the pair of sub open stubs 194, and the pair of main open stubs 184 with respect to the plane on which the main-line conductor 160 is formed has the effect of suppressing an undesirable asymmetric resonance mode which would be caused by an asymmetric structure. Thus, generation of undesired resonance frequencies can be prevented. The fifth variation can be combined with any of the other variations to utilize the advantages of any of the other variations.

[Sixth Variation]

Figure 9:
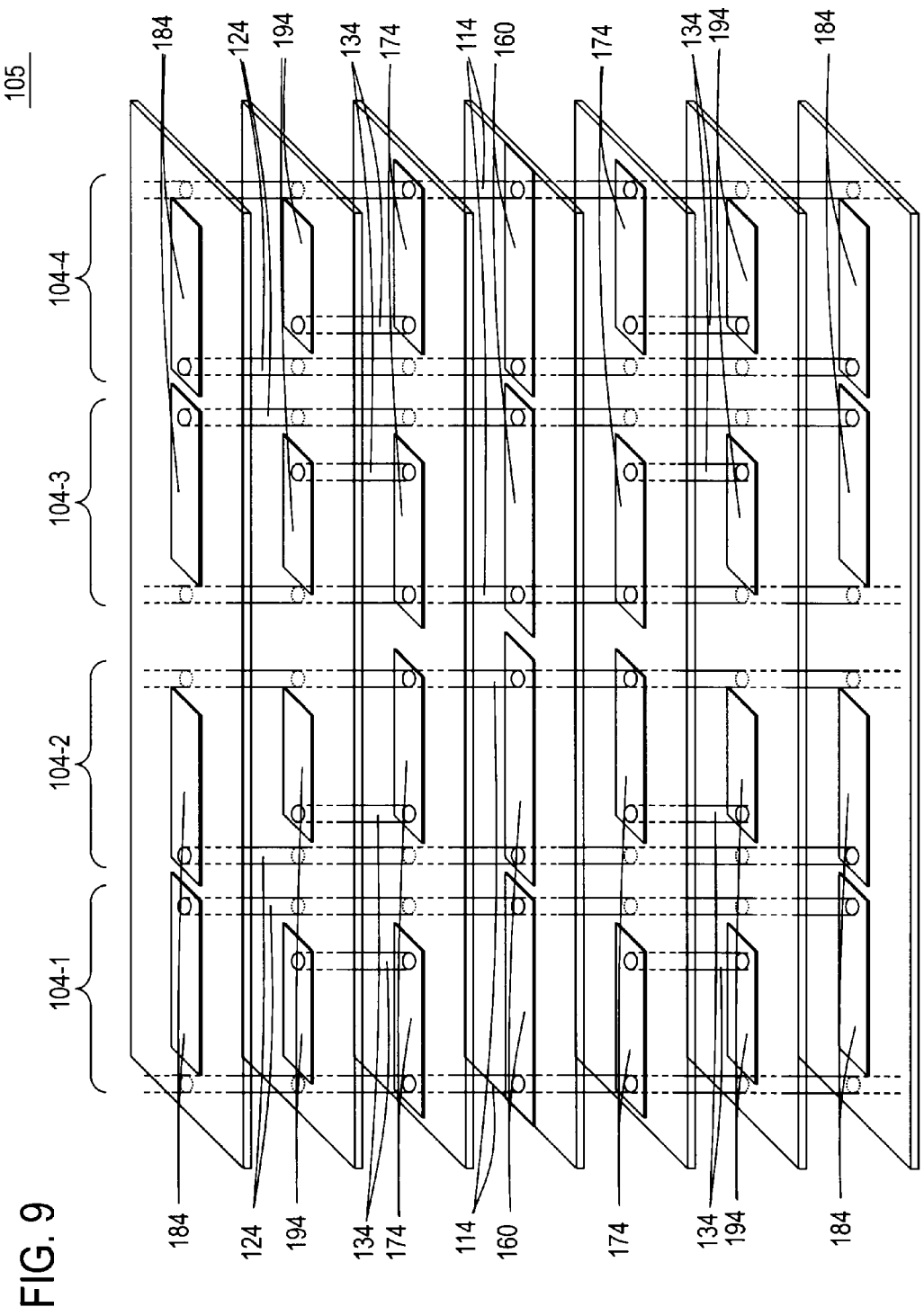
FIG. 9 is an exploded perspective view of a multiband resonator of a sixth variation of the first embodiment.

FIG. 9 is an exploded perspective view of a multiband resonator of a sixth variation of the first embodiment. The components are depicted as being transparent so that every component can be seen in FIG. 9. Furthermore, while master through conductors 114, main through conductors 124, and sub through conductors 134 are elongated in the exploded perspective view since dielectric layers are depicted as being separated, they have a length equal to the thickness of one or more dielectric layers in reality as illustrated in FIG. 1. While input-output lines are omitted from the figures, input-output lines may be formed on the same surface on which a main-line conductor is formed, for example. Ground conductors are omitted from FIG. 9. Two ground conductors may be provided on additional required dielectric layers vertically symmetrically with respect to the plane on which the main-line conductor 160 is formed.

The multiband resonator 105 includes four multiband resonators 104 of the fifth variation as resonance parts 104-1 to 104-4. The resonance parts 104-1 to 104-4 are arranged in series. The master through conductors 114 of the second and third resonance parts 104-2 and 104-3 may be replaced with a single common master through conductor 114 shared by the second and third resonance parts 104-2 and 104-3. If the second and third resonance parts 104-2 and 104-3 share a common master through conductor 114, the main-line conductor 160 of the second resonance part 104-2 is connected with the main-line conductor 160 of the third resonance part 104-3 and the sub-line conductor 174 of the second resonance part 104-2 is connected with the sub-line conductor 174 of the third resonance part 104-3. A multiband-pass filter can be fabricated by connecting a first input-output line to the main-line conductor 160 of the resonance part 104-1 of the multiband resonator 105 and connecting a second input-output line to the main-line conductor 160 of the resonance part 104-4, for example.

A multiband-pass filter that uses the multiband resonator of the sixth variation is capable of steeply change its blocking characteristics because of the configuration of the multiband resonator of the sixth variation described above. Thus, the multiband-pass filter is capable of properly blocking frequencies even just outside the passband while maintaining good passing characteristics that pass frequencies within the passband. The sixth variation can be combined with any of the other variations.

[Seventh Variation]

Figure 10:
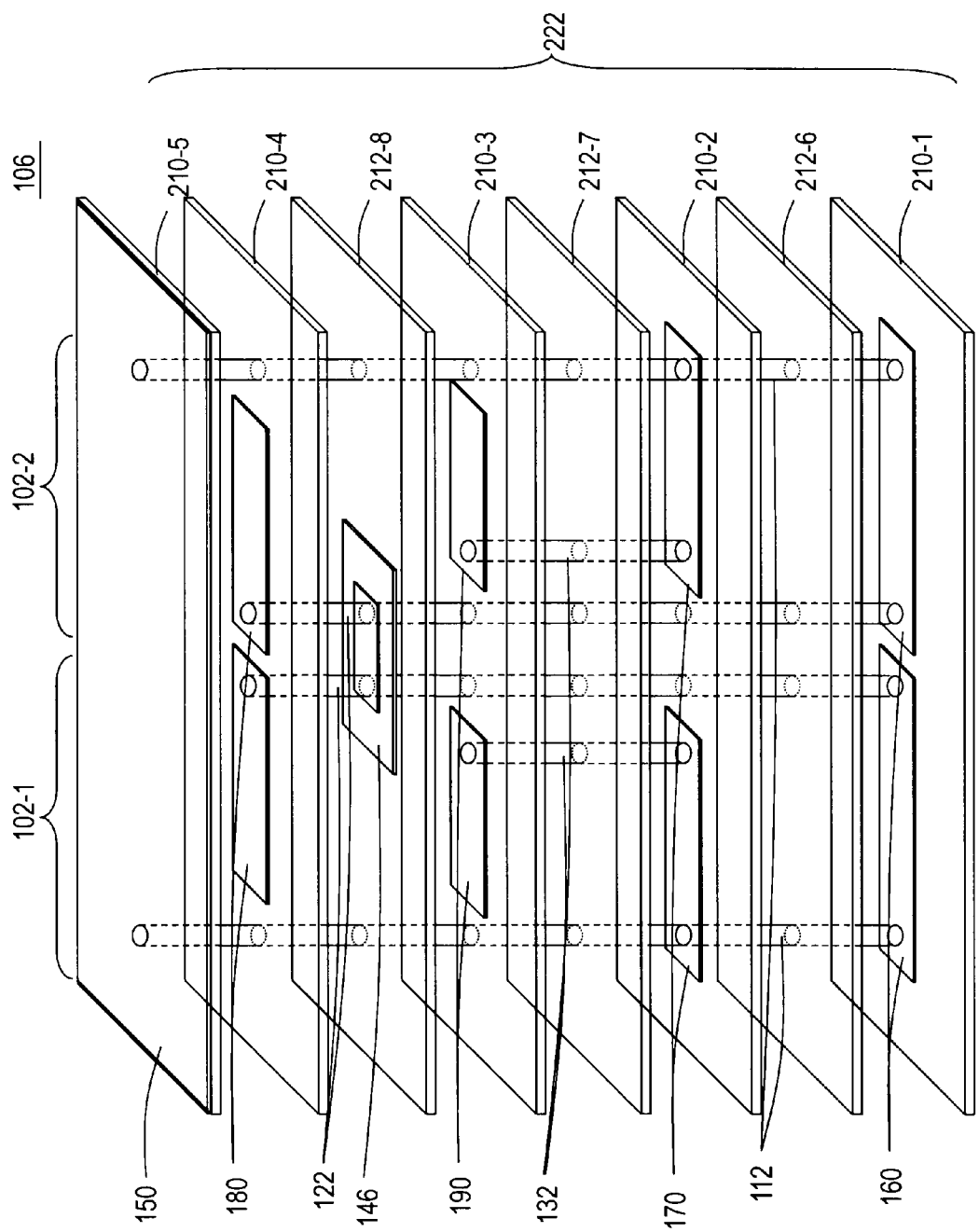
FIG. 10 is an exploded perspective view of a multiband resonator of a seventh variation of the first embodiment.

FIG. 10 is an exploded perspective view of a multiband resonator of a seventh variation of the first embodiment. The components are depicted as being transparent so that every component can be seen FIG. 10. Furthermore, while a master through conductor 112, a main through conductor 122, and a sub through conductor 132 are elongated in the exploded perspective view since dielectric layers are depicted as being separated, they have a length equal to the thickness of one or more dielectric layers in reality as illustrated in FIG. 1. While input-output lines are omitted from the figures, input-output lines may be formed on the same surface on which a main-line conductor is formed, for example.

The multiband resonator 106 includes two multiband resonators 102 of the third variation as resonance parts 102-1 and 102-2. The resonance parts 102-1 and 102-2 are arranged in series. A coupling conductor 146 is formed on a dielectric layer 212-8. A multiband-pass filter can be fabricated by connecting a first input-output line to the main-line conductor 160 of the resonance part 102-1 of the multiband resonator 106 and connecting a second input-output line to the main-line conductor 160 of the resonance part 102-2. Provision of the coupling conductor on the dielectric layer on which an open stub is not formed, as in this variation, allows adjustment of the amount of coupling between resonance parts over a wider range. Therefore, the multiband resonator can increase the flexibility of the design of the passband of the multiband-pass filter that uses the multiband resonator. The seventh variation can be combined with any of the other variations.

[Eighth Variation]

Figure 11:
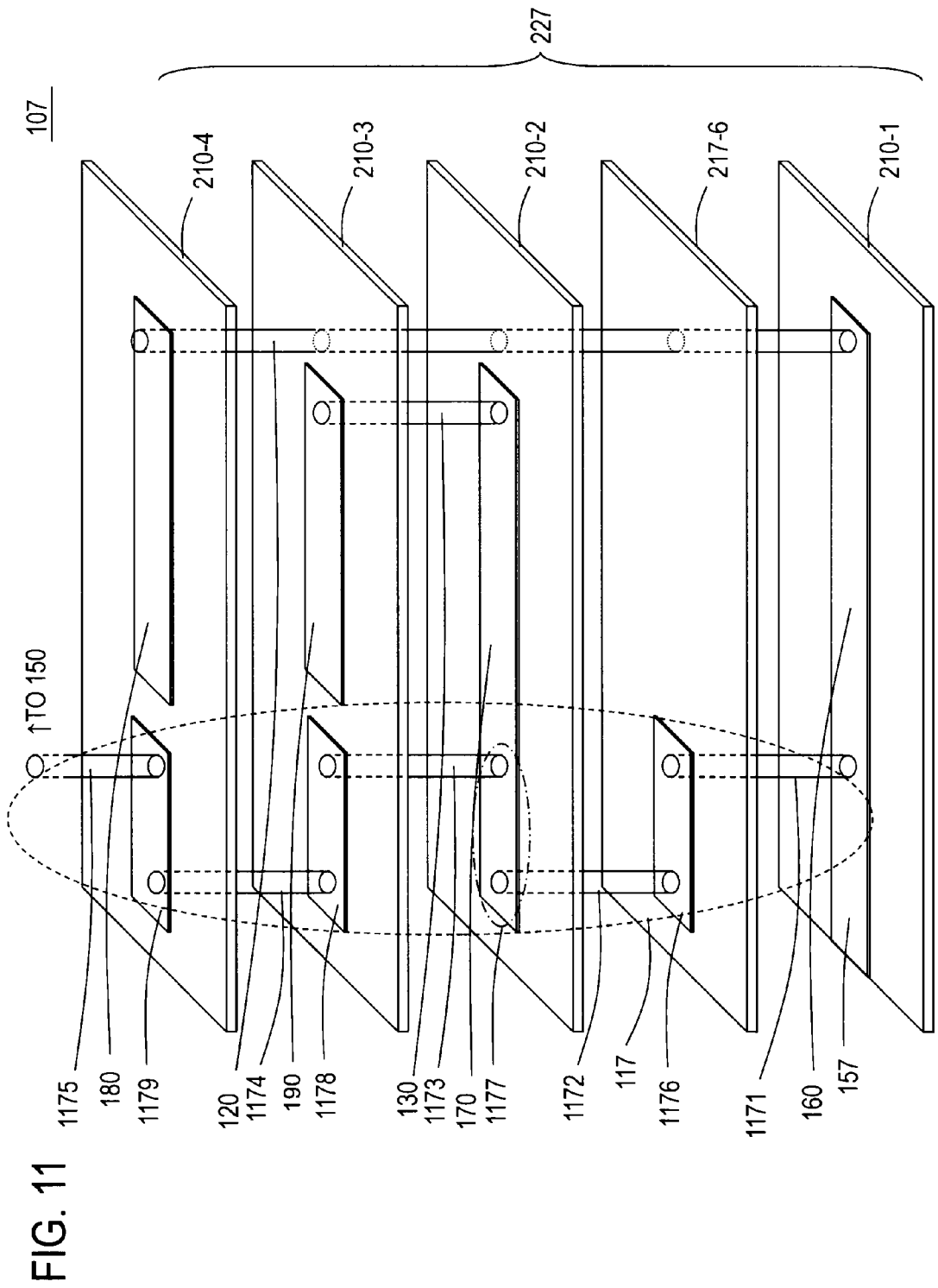
FIG. 11 is an exploded perspective view of a multiband resonator of an eighth variation of the first embodiment.

FIG. 11 is an exploded perspective view of a multiband resonator of a eighth variation of the first embodiment. The components are depicted as being transparent so that every component can be seen FIG. 11. Furthermore, while conductors, such as a main through conductor 120 and a sub through conductor 130, that interconnect dielectric layers are elongated in the exploded perspective view since dielectric layers are depicted as being separated, they have a length equal to the thickness of one or more dielectric layers in reality as illustrated in FIG. 1.

An input-output line conductor 157 of the multiband resonator 107 are also depicted in FIG. 11. A dielectric layer 217-6 is provided between dielectric layers 210-1 and 210-2 of a dielectric substrate 227. The input-output line conductor 157 is integral with a main-line conductor 160 on the surface (of the dielectric layer 210-1) on which the main-line conductor 160 is formed. A master through conductor 117 is designed into a meander structure for impedance matching. The master through conductor 117 includes through conductors 1171, 1172, 1173, 1174 and 1175 which interconnect dielectric layers and line conductors 1176, 1177, 1178 and 1179 on the dielectric layers, and electrically connects one end of the main-line conductor 160 to one end of the sub-line conductor 170 and to the ground conductor 150. The line conductor 1177 and the sub-line conductor 170 may be formed integrally with each other. The dimensions of each part of the meander structure may be approximately designed based on the impedance to be matched. The ground conductor 150 in the eighth variation may be formed on a dielectric layer of a part, which is not shown.

Since the master through conductor of the multiband resonator of the eighth variation has the meander structure, the impedance of the multiband resonator can be matched to that of a device external to the multiband resonator. The eighth variation can be combined with any of the other variations. A multiband-pass filter can be fabricated by providing multiple multiband resonators 107 as resonance parts and using the input-output line conductor of any of the resonance parts for input and the input-output line conductor of another one of the resonance parts for output.

[Ninth Variation]

Figure 12:
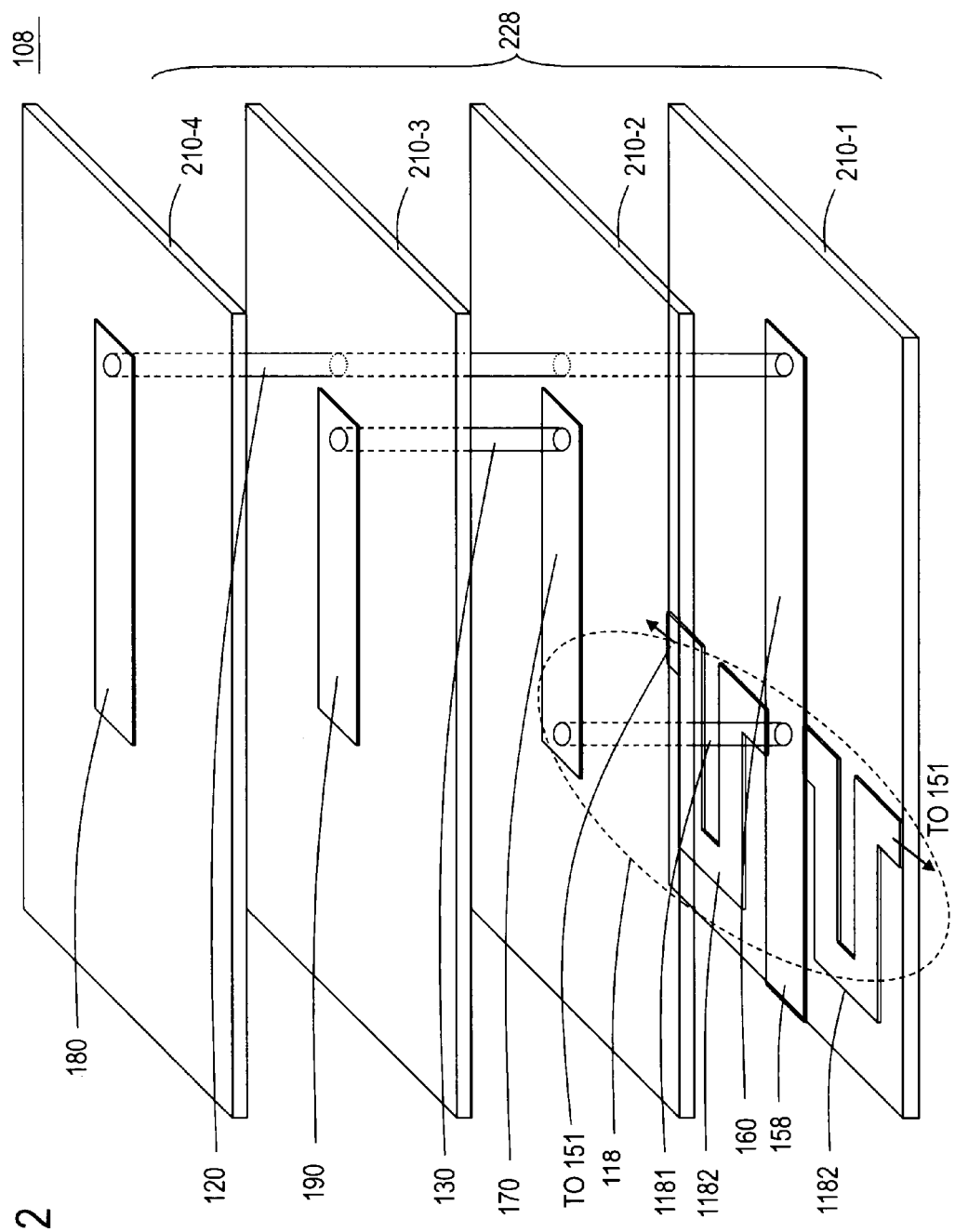
FIG. 12 is an exploded perspective view of a multiband resonator of a ninth variation of the first embodiment.

FIG. 12 is an exploded perspective view of a multiband resonator of a ninth variation of the first embodiment. The components are depicted as being transparent so that every component can be seen in FIG. 12. Furthermore, while conductors, such as a main through conductor 120 and a sub through conductor 130, that interconnect dielectric layers are elongated in the exploded perspective view since dielectric layers are depicted as being separated, they have a length equal to the thickness of one or more dielectric layers in reality as illustrated in FIG. 1.

The ninth variation illustrates impedance matching of a multiband resonator having a ground conductor 151 (not depicted) formed on a part such as a side of the multiband resonator. A dielectric substrate 228 of the multiband resonator 108 includes at least four dielectric layers 210-1 to 210-4. The multiband resonator 108 has an input-output line conductor 158 formed on the surface (of the dielectric layer 210-1) on which a main-line conductor 160 is formed. A master through conductor 118 has a meander structure for impedance matching. The master through conductor 118 includes a through conductor 1181 and a line conductor 1182. The through conductor 1181 electrically connects one end of the main-line conductor 160 to one end of a sub-line conductor 170 that is aligned with that end of the main-line conductor 160. The line conductor 1182 is a meander-like line conductor formed on the dielectric layer 210-1 and electrically connects the main-line conductor 160 to the ground conductor 151.

Since the master through conductor of the multiband resonator of the ninth variation has the meander structure, the impedance of the multiband resonator can be matched to that of a device external to the multiband resonator. The ninth variation can be combined with any of the other variations. A multiband-pass filter can be fabricated by providing multiple multiband resonators 108 as resonance parts and using the input-output line conductor of any of the resonance parts for input and the input-output line conductor of another one of the resonance parts for output.

[Simulations]

Figure 13:
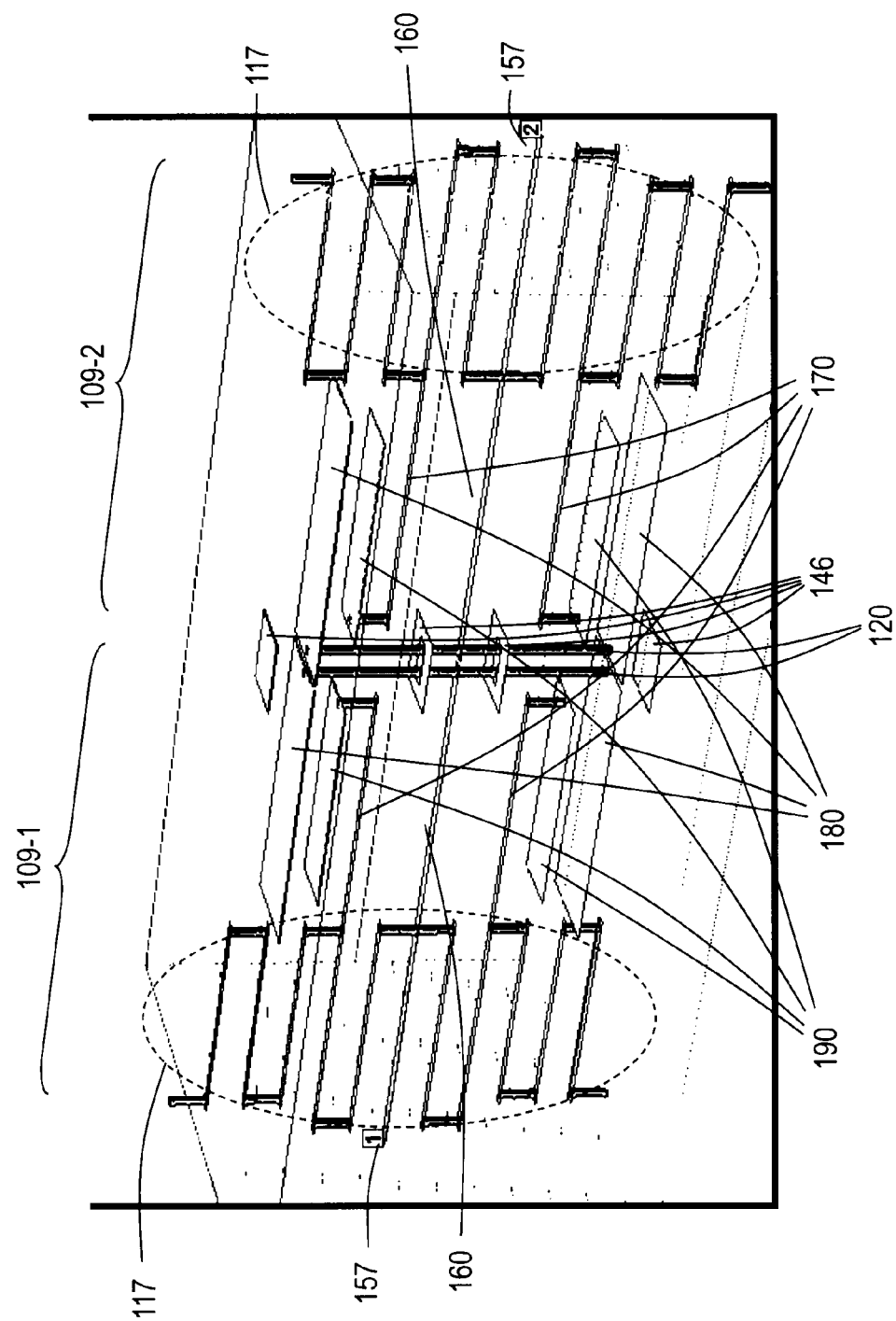
FIG. 13 is a diagram illustrating a configuration of a multiband-pass filter in a first simulation.
Figure 14:
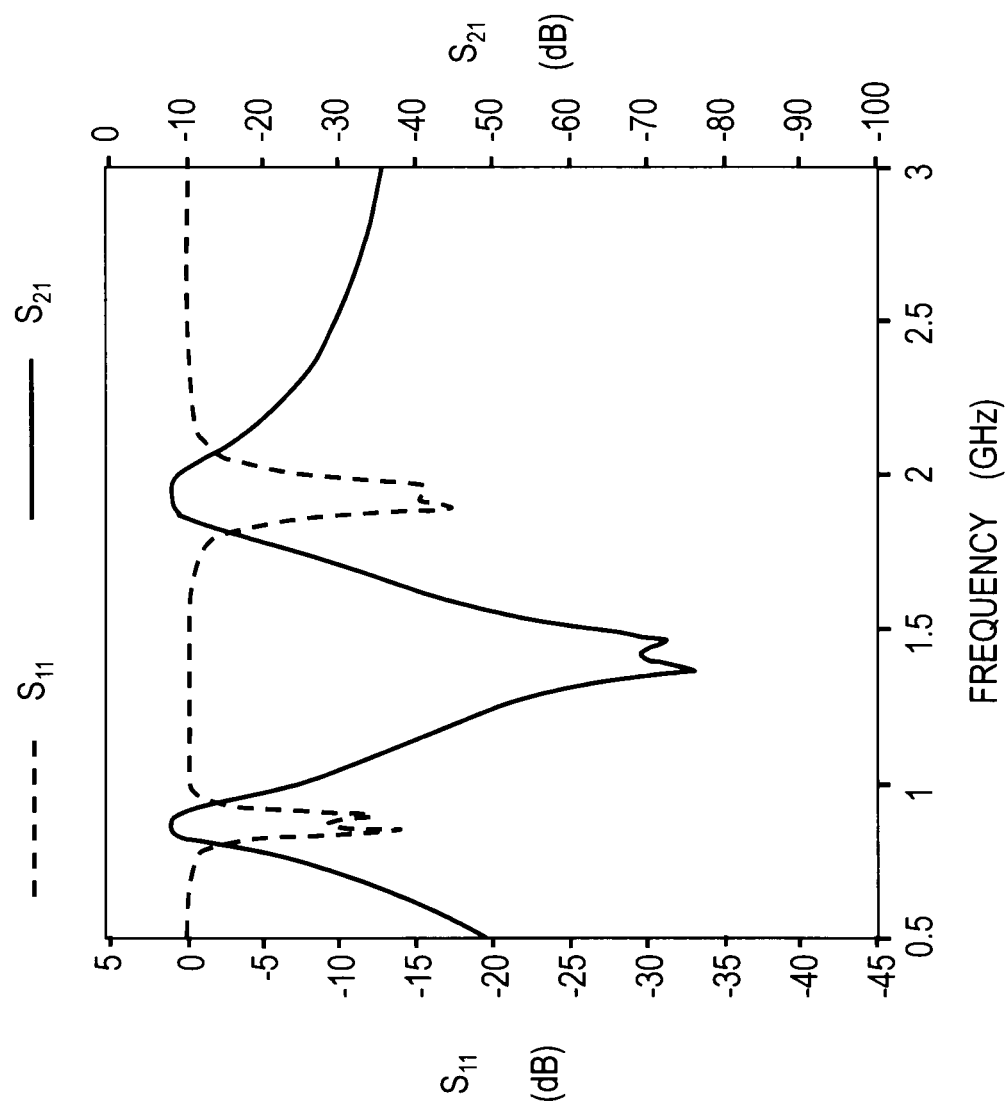
FIG. 14 is a graph illustrating results of the simulation of the frequency response of the multiband-pass filter in FIG. 13.

FIG. 13 illustrates a configuration of a multiband-pass filter in a first simulation. The multiband-pass filter has two multiband resonators 104 arranged in series as resonance parts and wider main and sub open stubs 180 and 190, and a coupling conductor 146 for enhancing the coupling between the resonance parts. The master through conductor 117 of each of the multiband resonators 104 has a meander structure for impedance matching. The permittivity of the dielectric substrate is on the order of 10 and the thickness of each dielectric layer is several hundred micrometers. The line conductors have a line width of approximately 200 μm and the open stubs have a line width of approximately 1 mm. In the multiband-pass filter, a signal is input through an end labeled with the number 1 enclosed in a square in the figure and a signal is output through an end labeled with the number 2 enclosed in a square. FIG. 14 illustrates the results of the simulation of the frequency response of the multiband-pass filter of FIG. 13. The dashed curve represents reflectance loss ($S_{11}$) and the solid curve represents insertion loss ($S_{21}$). It can be seen from the graph that the insertion loss is nearly 3 dB and the reflectance loss is approximately 10 dB around 1 GHz and 2 GHz.

Figure 15:
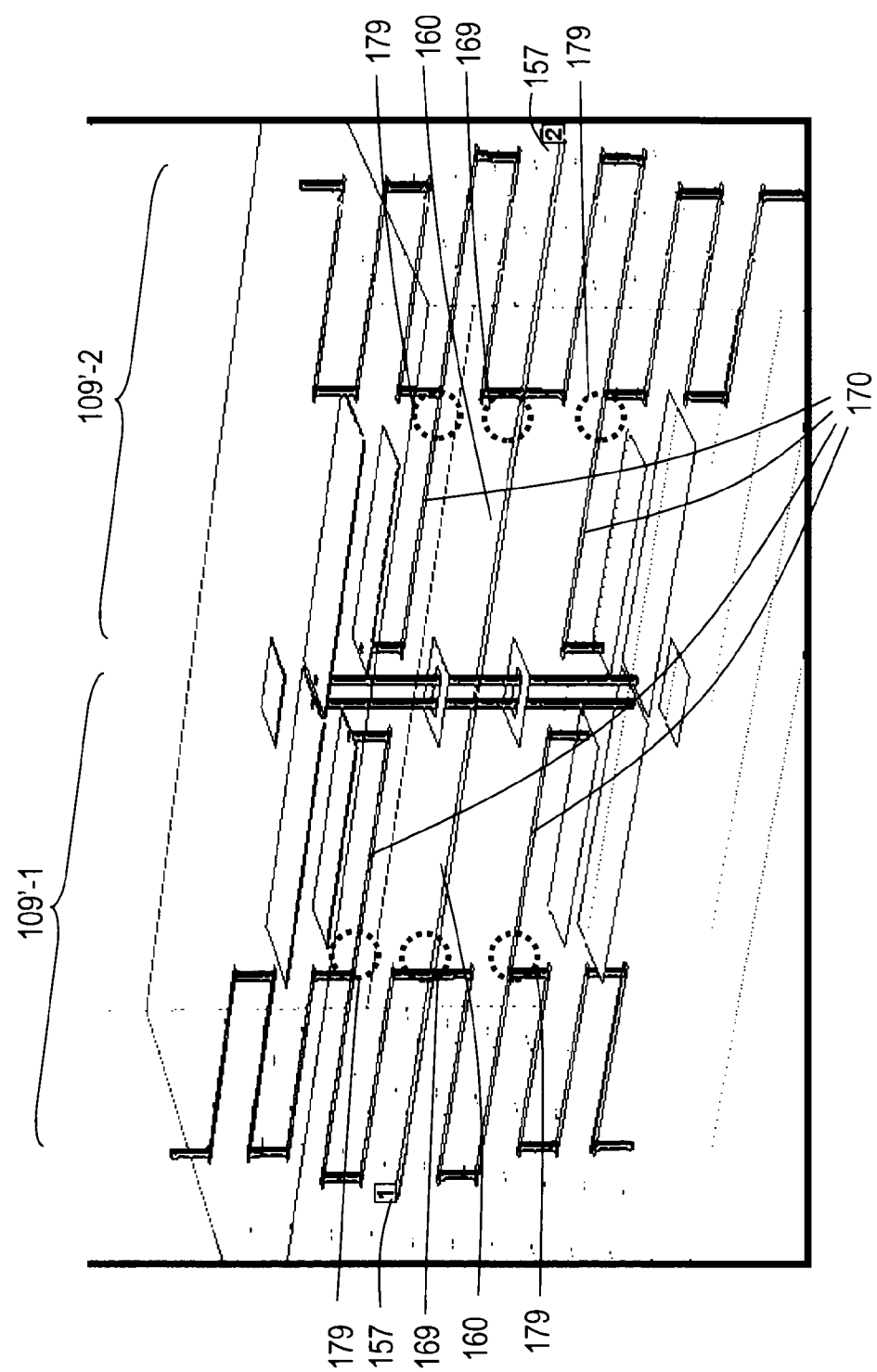
FIG. 15 is a diagram illustrating a configuration of a multiband-pass filter in a second simulation.
Figure 16:
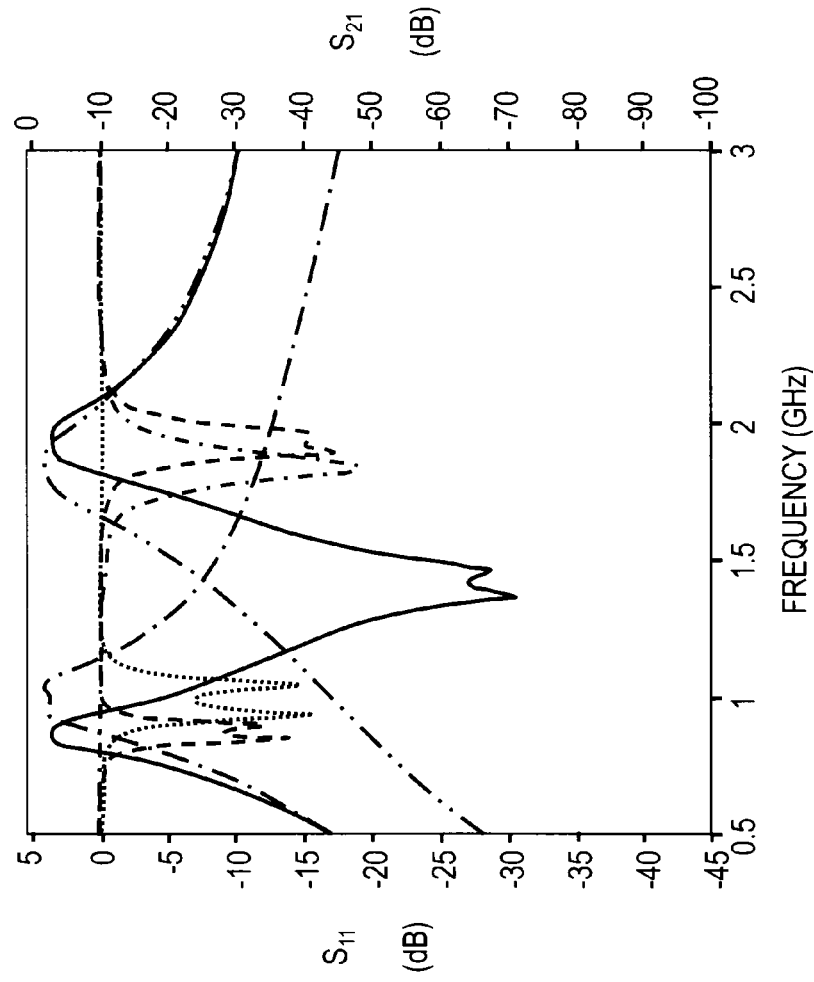
FIG. 16 is a graph illustrating results of the simulation of the frequency response of the multiband-pass filter in FIG. 15.

FIG. 15 illustrates a configuration of a multiband-pass filter in a second simulation. The multiband-pass filter has a main switch 169 provided in the main-line conductor 160 of each of the multiband resonators in FIG. 13 and a sub switch 179 provided in the sub-line conductor 170 of the multiband resonator. In the multiband-pass filter, a signal is input through an end labeled with the number 1 enclosed in a square in the figure and a signal is output through an end labeled with the number 2 enclosed in a square. FIG. 16 illustrates the results of the simulation of the frequency response of the multiband-pass filter of FIG. 15. When the main and sub switches 169 and 179 are on, the same results as shown in FIG. 14 are obtained. When the main switches 169 are on and the sub switches 179 are off, the insertion loss is nearly 3 dB and the reflectance loss is approximately 10 dB only around 1 GHz. When the main switches 169 are off and the sub switches 179 are on, the insertion loss is nearly 3 dB and the reflectance loss is approximately 15 dB only around 2 GHz. The results show that a multiband-pass filter or a resonance-band-selective filter can be formed by providing switches as described above.

Figure 17:
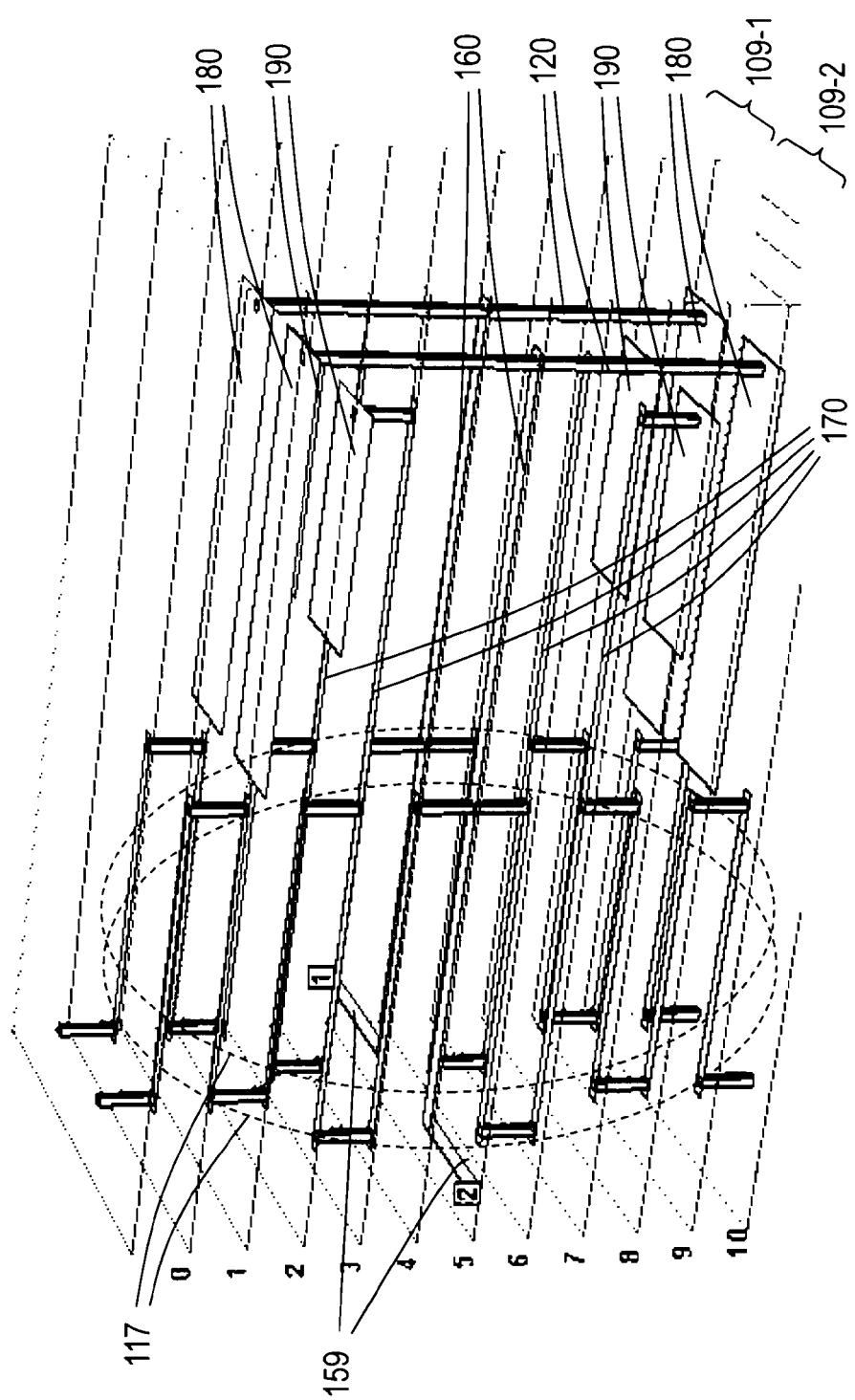
FIG. 17 is a diagram illustrating a configuration of a multiband-pass filter in a third simulation.
Figure 18:
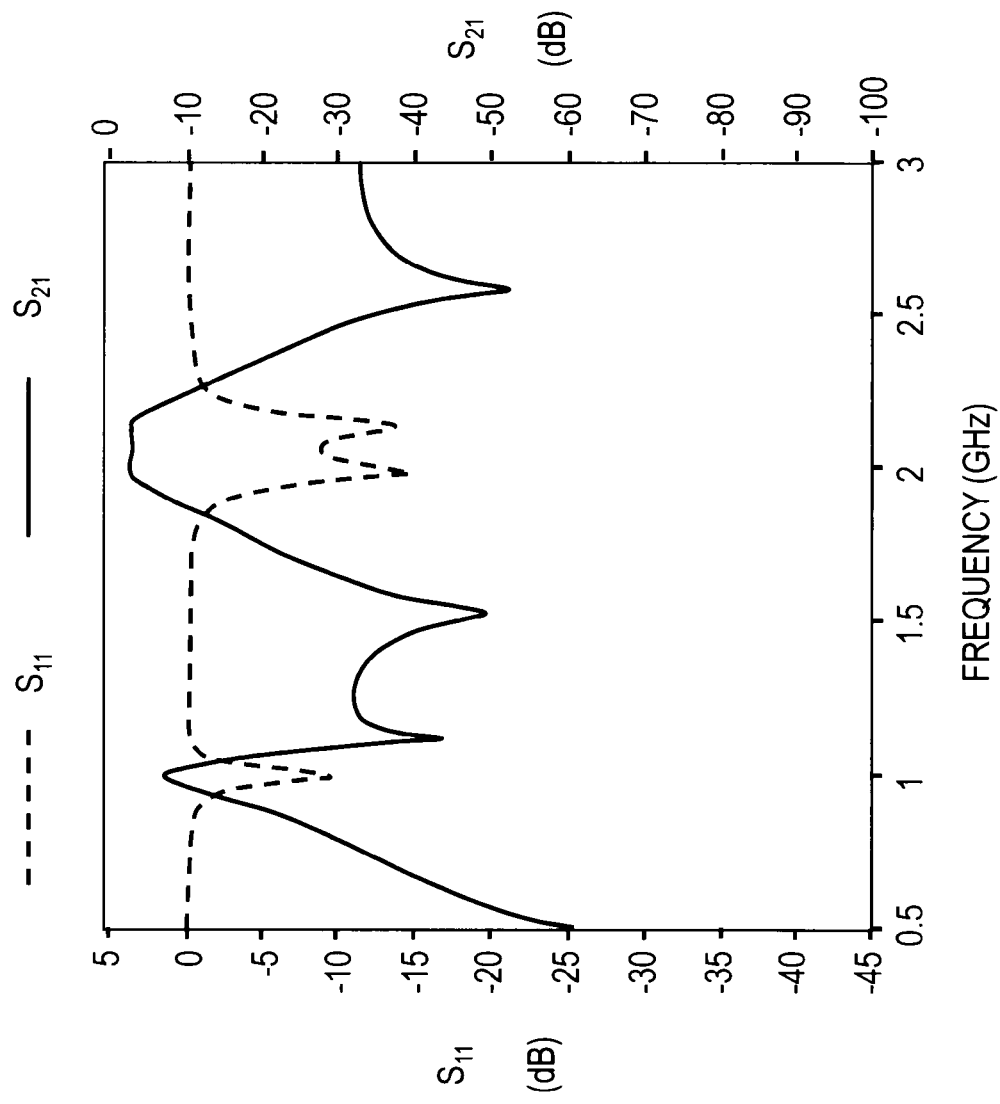
FIG. 18 is a graph illustrating results of the simulation of the frequency response of the multiband-pass filter in FIG. 17.

FIG. 17 illustrates a configuration of a multiband-pass filter in a third simulation. The multiband-pass filter has two multiband resonators 104 arranged in parallel with each other as resonance parts and wider main and sub open stubs 180 and 190. The master through conductor 117 of each of the multiband resonators 104 has a meander structure for impedance matching. The permittivity of the dielectric substrate is on the order of 10 and the thickness of each dielectric layer is several hundred micrometers. The line conductors have a line width of approximately 200 μM and the open stubs have a line width of approximately 1 mm. In the multiband-pass filter, a signal is input through an end labeled with the number 1 enclosed in a square in the figure and a signal is output through an end labeled with the number 2 enclosed in a square. FIG. 18 illustrates the results of the simulation of frequency response of the multiband-pass filter of FIG. 17. It can be seen from the graph that the insertion loss is nearly 3 dB and the reflectance loss is approximately 10 dB around 1 GHz and 2 GHz.

Second Embodiment

Figure 19:
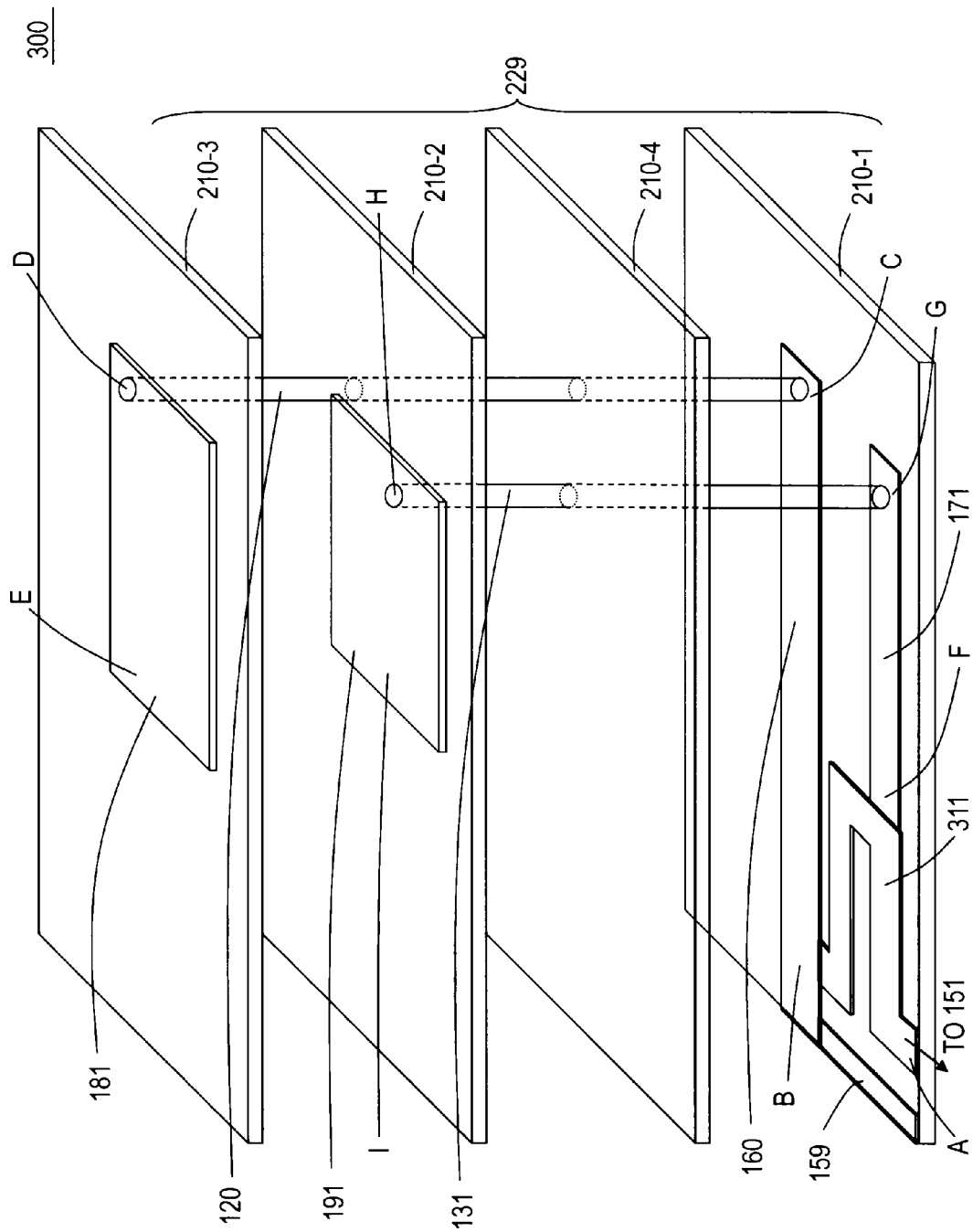
FIG. 19 is an exploded perspective view of a multiband resonator of a second embodiment.

In the first embodiment, the main-line conductor and the sub-line conductor are formed on different dielectric layers. In a second embodiment, a main-line conductor and a sub-line conductor are formed on the same dielectric layer. FIG. 19 is an exploded perspective view of a multiband resonator of the second embodiment. In the figure, dielectric layers, which are actually attached tightly to one another as illustrated in FIG. 1, are depicted as being separated. It should be noted that while the components are depicted as being transparent so that every component can be seen, the components do not need to be transparent and that in many cases the components are made of opaque materials. Furthermore, while a main through conductor 120, and a sub through conductor 131 are elongated in the exploded perspective view in FIG. 19 since dielectric layers are depicted as being separated, they have a length equal to the thickness of one or more dielectric layers in reality as illustrated in FIG. 1.

The multiband resonator 300 includes a dielectric substrate 229, a ground conductor 151, a main-line conductor 160, a sub-line conductor 171, a sub open stub 191, a main open stub 181, a first short-circuit line conductor 311, a main through conductor 120, a sub through conductor 131, and an input-output line conductor 159. The ground conductor 151, which is not depicted in FIG. 19, may be formed so as to cover the entire dielectric substrate 229 (all of the six surfaces). The dielectric substrate 229 comprises first to fourth dielectric layers 210-1, . . . , 210-4. The main-line conductor 160 is formed on the first dielectric layer 210-1. The sub-line conductor 171 is formed on the first dielectric layer 210-1. The sub open stub 191 is formed on the second dielectric layer 210-2. The main open stub 181 is formed on the third dielectric layer 210-3. The first short-circuit line conductor 311 electrically connects one end of the main-line conductor 160 to one end of the sub-line conductor 171 and to the ground conductor 151. The main through conductor 120 electrically connects the other end of the main-line conductor 160 to one end of the main open stub 181 that is aligned with that other end of the main-line conductor 160. The sub through conductor 131 electrically connects the other end of the sub-line conductor 171 to one end of the sub open stub 191 that is aligned with that other end of the sub-line conductor 171. The term "aligned" as used herein means that the ends practically coincide with each other when the dielectric substrate 229 is viewed in the direction normal to the plane of the dielectric substrate 229 (that is, when viewed from above the plane).

The main open stub 181 and the sub open stub 191 may be wider than the main-line conductor 160 and the sub-line conductor 171. The dielectric substrate 229 in the example in FIG. 19 includes the fourth dielectric layer 210-4, which is an additional dielectric layer on which none of the main-line conductor 160, the sub-line conductor 171, the sub open stub 191, and the main open stub 181 is formed. The fourth dielectric layer 210-4 is provided between the first dielectric layer 210-1 on which the main-line conductor 160 and the sub-line conductor 171 are formed and the second dielectric layer 210-2 on which the sub open stub 191 is formed. The insertion of the additional dielectric layer on which none of the main-line conductor, the sub-line conductor, the sub open stub and the main open stub is formed enables adjustment of the distances among the main-line conductor, the sub-line conductor, the sub open stub and the main open stub. Of course, the distances may be adjusted by changing the thicknesses of the dielectric layers. In addition, more dielectric layers may be added.

The principle of resonance is the same as that in the first embodiment. The first resonance mode can be considered as resonance in which the electrical length from point A (short-circuit point) that is in contact with the ground conductor 151 to the open end E of the main open stub 181 (A-B-C-D-E) is approximately equal to a ¼ wavelength. The second resonance mode can be considered as resonance in which the electrical length from point A (short-circuit point) that is in contact with the ground conductor 151 to the open end I of the sub open stub 191 (A-F-G-H-I) is approximately equal to a ¼ wavelength.

Because of the configuration and principle described above, a multiband resonator 300 that has multiple resonance frequency bands can be (integrally) fabricated with shared common components. Accordingly, the multiband resonator 300 can be fabricated in small size. Furthermore, the multiband resonator 300 comprises the first short-circuit line conductor 311 in place of the master through conductor 110 of the first embodiment. The master through conductor 110 requires a through hole that passes through the dielectric layers. In contrast, the first short-circuit line conductor 311 can be formed simultaneously together with the main-line conductor 160 and the sub-line conductor 171. Accordingly, the multiband resonator 300 is easier to manufacture than the structure of the first embodiment.

The resonance frequency bands (passbands in the case of a multiband-pass filter fabricated with the multiband resonator) can be adjusted by changing the thickness and permittivity of the dielectric layers and the lengths and widths of the main-line conductor 160 and the main open stub 181, and the lengths and widths of the sub-line conductor 171 and the sub open stub 191. While the other end E of the main open stub 181, and the other end I of the sub open stub 191 are aligned with each other in FIG. 19, they do not necessarily need to be aligned with each other and may be designed otherwise as appropriate for adjustment. The first short-circuit line conductor 311 in FIG. 19 has a meander structure, which enables matching of the impedance of the multiband resonator to that of a device external to the multiband resonator. However, the first short-circuit line conductor 311 does not necessarily need to be of the meander structure and may be otherwise designed as appropriate. Furthermore, an LC parallel resonance circuit may be provided between end C of the main-line conductor 160 and the ground conductor 151. The LC parallel resonance circuit may be a lumped-parameter element.

A multiband-pass filter can be fabricated by providing multiple multiband resonators 300 as resonance parts 300 and using the input-output line conductor of any of the resonance parts 300 for input and the input-output line conductor of another one of the resonance parts for output as described with respect to the sixth and seventh variations of the first embodiment. In this case, all the resonance parts 300 are formed on the same dielectric substrate. In addition, a coupling conductor 146 for coupling the resonance parts with each other may be provided. The coupling conductor 146 is formed on any of the dielectric layers on which none of the main-line conductor 160, the sub-line conductor 171, the sub open stub 191, and the main open stub 181 is formed.

[First Variation]

Figure 20:
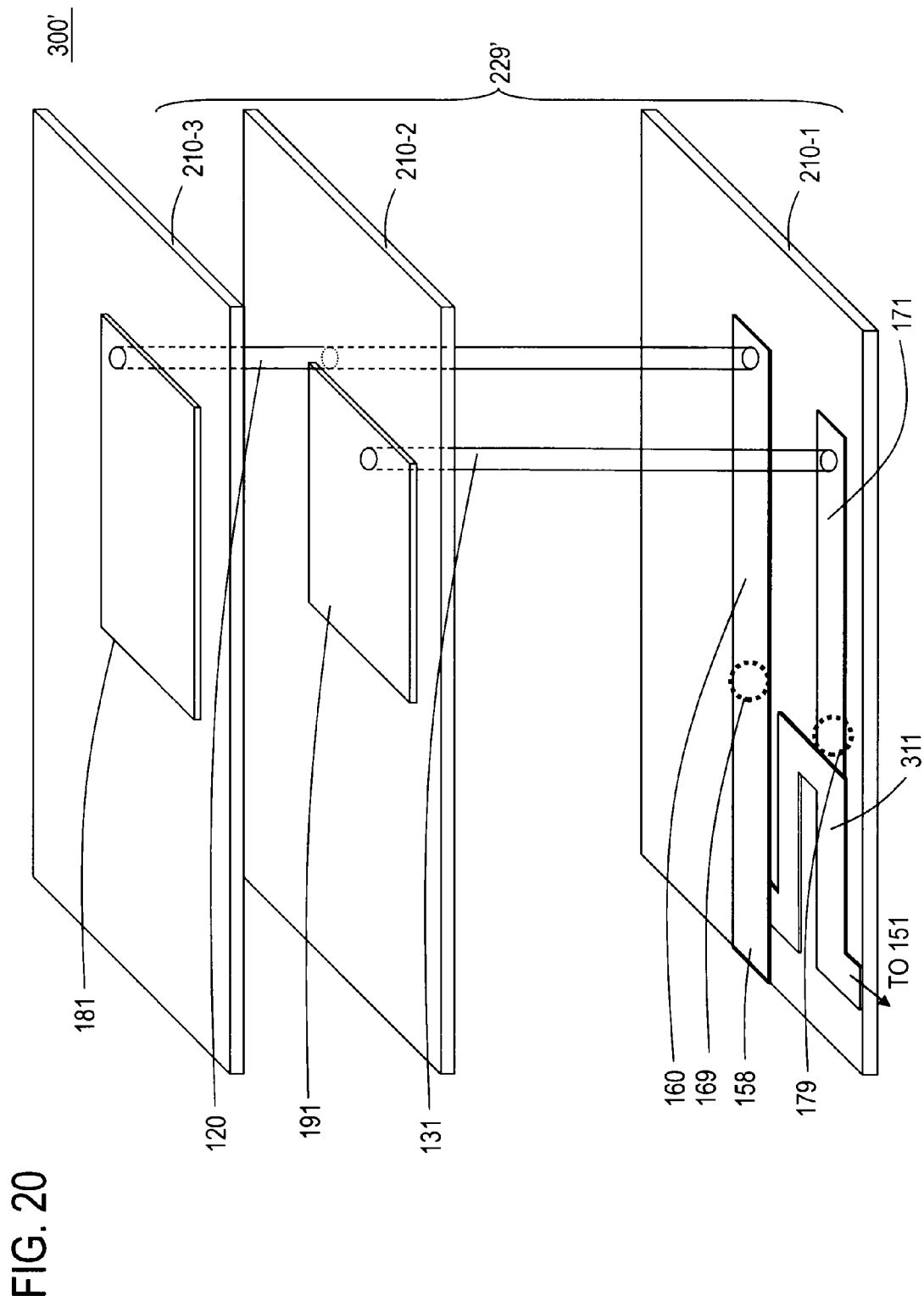
FIG. 20 is an exploded perspective view of a multiband resonator of a first variation of the second embodiment.

FIG. 20 is an exploded perspective view of a multiband resonator of a first variation of the second embodiment. The components are depicted as being transparent so that every component can be seen in FIG. 20. Furthermore, while a main through conductor 120 and a sub through conductor 131 are elongated in the exploded perspective view in FIG. 20 since dielectric layers are depicted as being separated, they have a length equal to the thickness of one or more dielectric layers in reality as illustrated in FIG. 1.

The multiband resonator 300' has a configuration similar to that of the multiband resonator 300, except that the dielectric layer 210-4 is eliminated, a main switch 169 and a sub switch 179 are added, and an input-output line conductor 158 is provided. The number of the dielectric layers may be reduced by increasing the thickness of the dielectric layer 210-2, for example, while maintaining the characteristic of the dielectric layers. If it is desirable to reduce the total thickness of the dielectric layers depending on characteristics required, the dielectric layer 210-4 may simply be eliminated.

Like the first variation of the first embodiment, if the multiband resonator is to be allowed to function as a multiband resonator having multiple resonance frequency bands and also as a resonance-band-selective resonator, a main switch 169 and a sub switch 179 may be added. Any of a variation in which the dielectric layer 210-4 is eliminated, a variation in which the main and sub switches 169 and 179 are added, and a variation in which an input-output line conductor is provided can be independently chosen. A multiband-pass filter can be fabricated by providing multiple multiband resonators 300' as resonance parts and using the input-output line conductor of any of the resonance parts 300' for input and the input-output line conductor of another one of the resonance parts for output.

[Second Variation]

Figure 21:
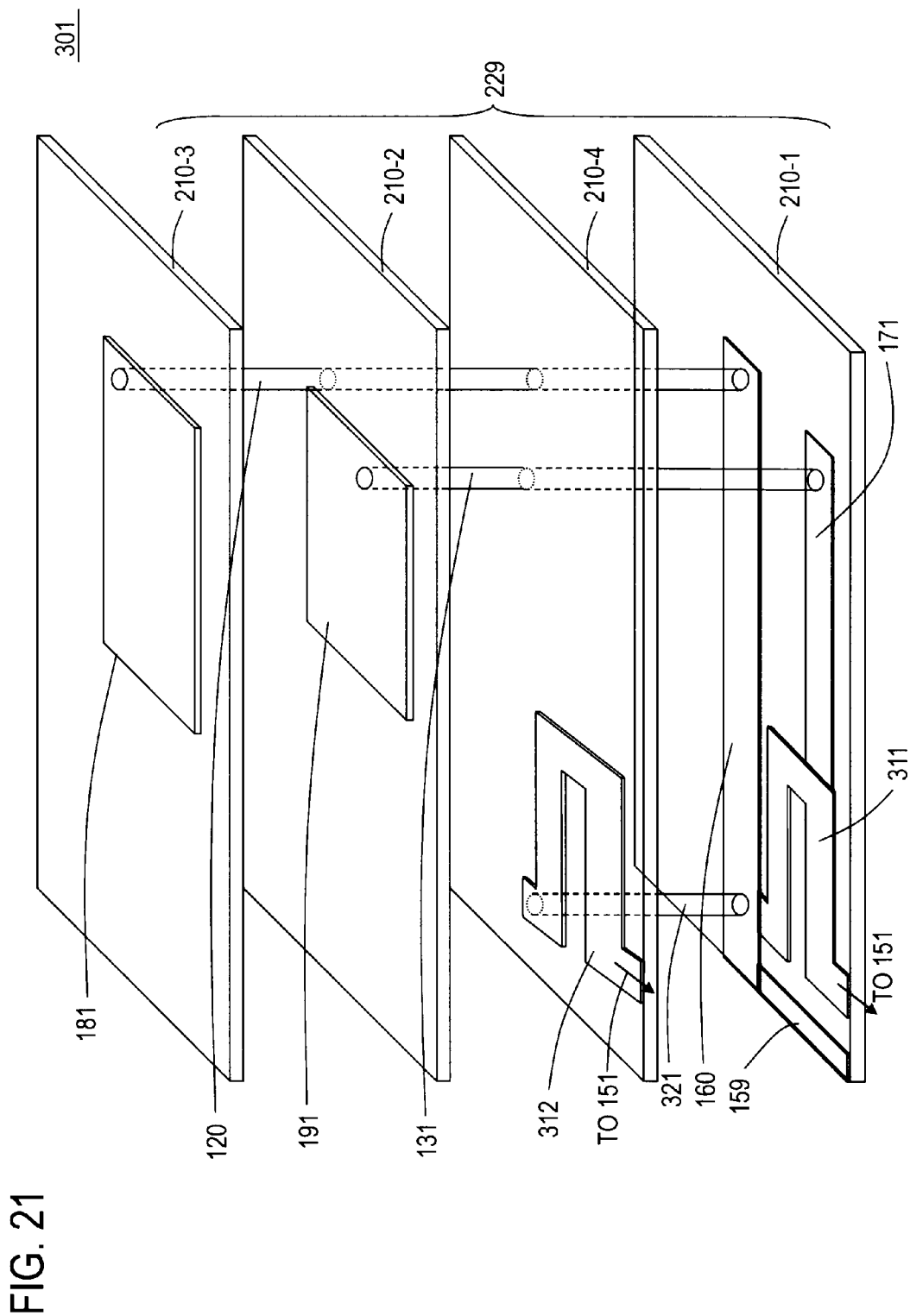
FIG. 21 is an exploded perspective view of a multiband resonator of a second variation of the second embodiment.

FIG. 21 is an exploded perspective view of a multiband resonator of a second variation of the second embodiment. The components are depicted as being transparent so that every component can be seen in FIG. 21. Furthermore, while a main through conductor 120, a sub through conductor 131 and a short-circuit through conductor 321 are elongated in the exploded perspective view in FIG. 21 since dielectric layers are depicted as being separated, they have a length equal to the thickness of one or more dielectric layers in reality as illustrated in FIG. 1.

The multiband resonator 301 has the configuration similar to that of the multiband resonator 300, except that a second short-circuit line conductor 312 and a short-circuit through conductor 321 are added. The second short-circuit line conductor 312 is formed on a fourth dielectric layer 210-4. One end of the second short-circuit line conductor 312 is connected to a ground conductor 151. The short-circuit through conductor 321 electrically connects the one end of the main-line conductor 160 to the other end of the second short-circuit line conductor 312. The rest of the configuration of the multiband resonator 301 is the same as that of the multiband resonator 300.

The first short-circuit line conductor 311 and the second short-circuit line conductor 312 in FIG. 21 have a meander structure, which enables matching of the impedance of the multiband resonator to that of a device external to the multiband resonator. However, the first and second short-circuit line conductors 311 and 312 do not necessarily need to have a meander structure and may be otherwise designed as appropriate. The second variation can be combined with the first variation. The characteristics of the multiband resonator of the second variation can be more easily adjusted than in the second embodiment described above because the shapes and lengths of the short-circuit line conductors can be more readily changed.

Furthermore, as described with respect to the sixth and seventh variations of the first embodiment, a multiband-pass filter can be fabricated by providing multiple multiband resonators 301 as resonance parts 301 and using the input-output line conductor of any of the resonance parts 301 for input and the input-output line conductor of another one of the resonance parts for output. In this case, all the resonance parts 301 are formed on the same dielectric substrate. In addition, a coupling conductor 146 for coupling the resonance parts 301 with each other may be provided. The coupling conductor 146 is formed on any of the dielectric layers on which none of the main-line conductor 160, the sub-line conductor 171, the sub open stub 191 and the main open stub 181 is formed.

[Third Variation]

Figure 22:
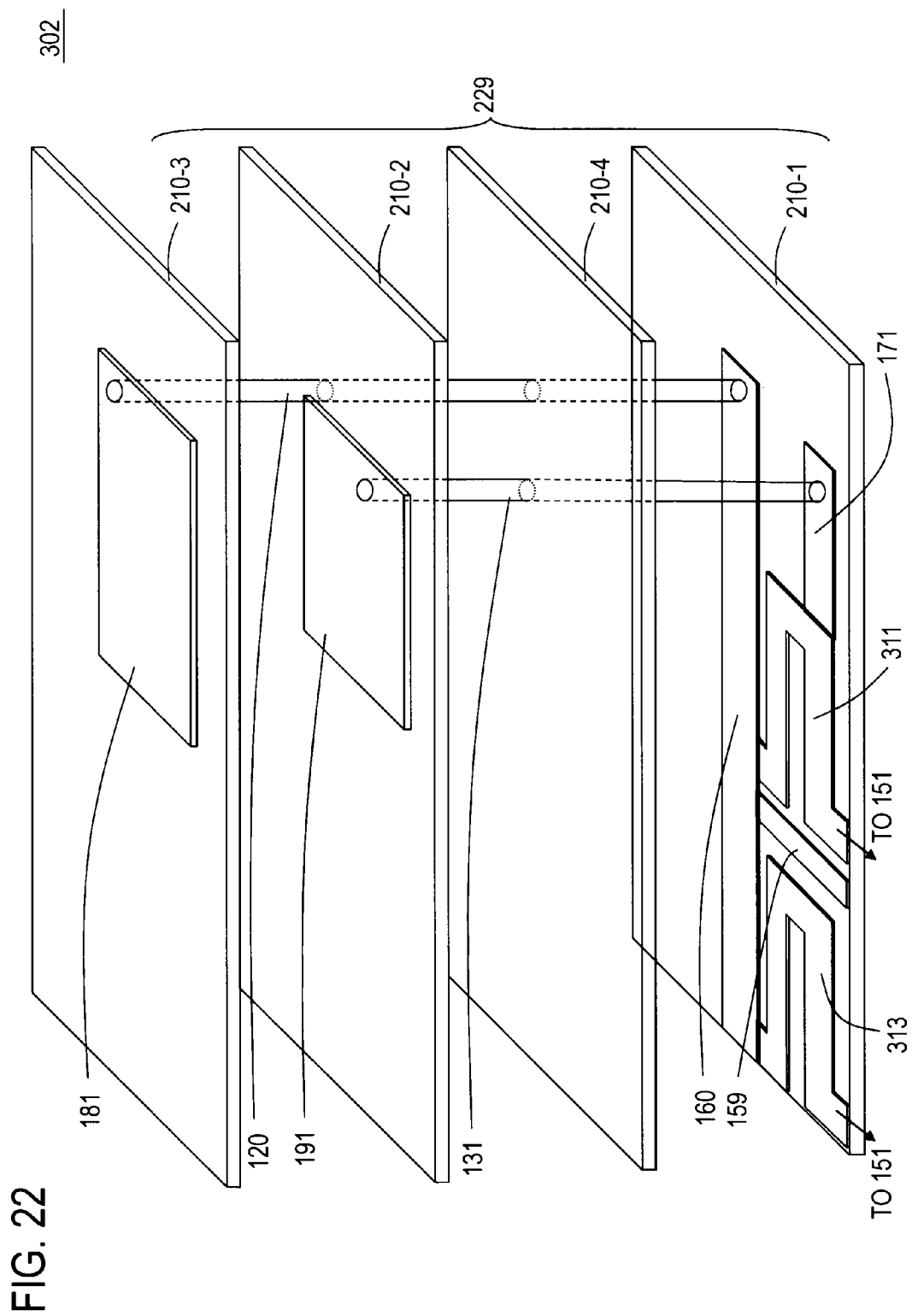
FIG. 22 is an exploded perspective view of a multiband resonator of a third variation of the second embodiment.

FIG. 22 is an exploded perspective view of a multiband resonator of a third variation of the second embodiment. The components are depicted as being transparent so that every component can be seen in FIG. 22. Furthermore, while a main through conductor 120 and a sub through conductor 131 are elongated in the exploded perspective view in FIG. 22 since dielectric layers are depicted as being separated, they have a length equal to the thickness of one or more dielectric layers in reality as illustrated in FIG. 1.

The multiband resonator 302 has a configuration similar to that of the multiband resonator 300, except that a second short-circuit line conductor 313 is added. The second short-circuit line conductor 313 is formed on the first dielectric layer 210-1 and electrically connects the one end of the main-line conductor 160 to a ground conductor 151. The rest of the configuration of the multiband resonator 302 is the same as that of the multiband resonator 300.

The first and second short-circuit line conductors 311 and 312 in FIG. 22 have a meander structure, which enables matching of the impedance of the multiband resonator to that of a device external of the multiband resonator. However, the first and second short-circuit line conductors 311 and 312 do not necessarily need to have a meander structure and may be otherwise designed as appropriate. The third variation can be combined with the first variation. The characteristics of the multiband resonator of the third variation can be more easily adjusted than in the second embodiment described above because the shapes and lengths of the short-circuit line conductors can be more readily changed. Furthermore, the multi-band resonator of the third variation is easier to manufacture than that of the second variation because a short-circuit through conductor is not required and accordingly less holes need to be provided in the dielectric layers.

Furthermore, as described with respect to the sixth and seventh variations of the first embodiment, a multiband-pass filter can be fabricated by providing multiple multiband resonators 302 as resonance parts 302 and using the input-output line conductor of any of the resonance parts 302 for input and the input-output line conductor of another one of the resonance parts 302 for output. In this case, all the resonance parts 302 are formed on the same dielectric substrate. In addition, a coupling conductor 146 for coupling the resonance parts 302 with each other may be provided. The coupling conductor 146 is formed on any of the dielectric layers on which none of the main-line conductor 160, the sub-line conductor 171, the sub open stub 191 and the main open stub 181 is formed.

[Fourth Variation]

Figure 23:
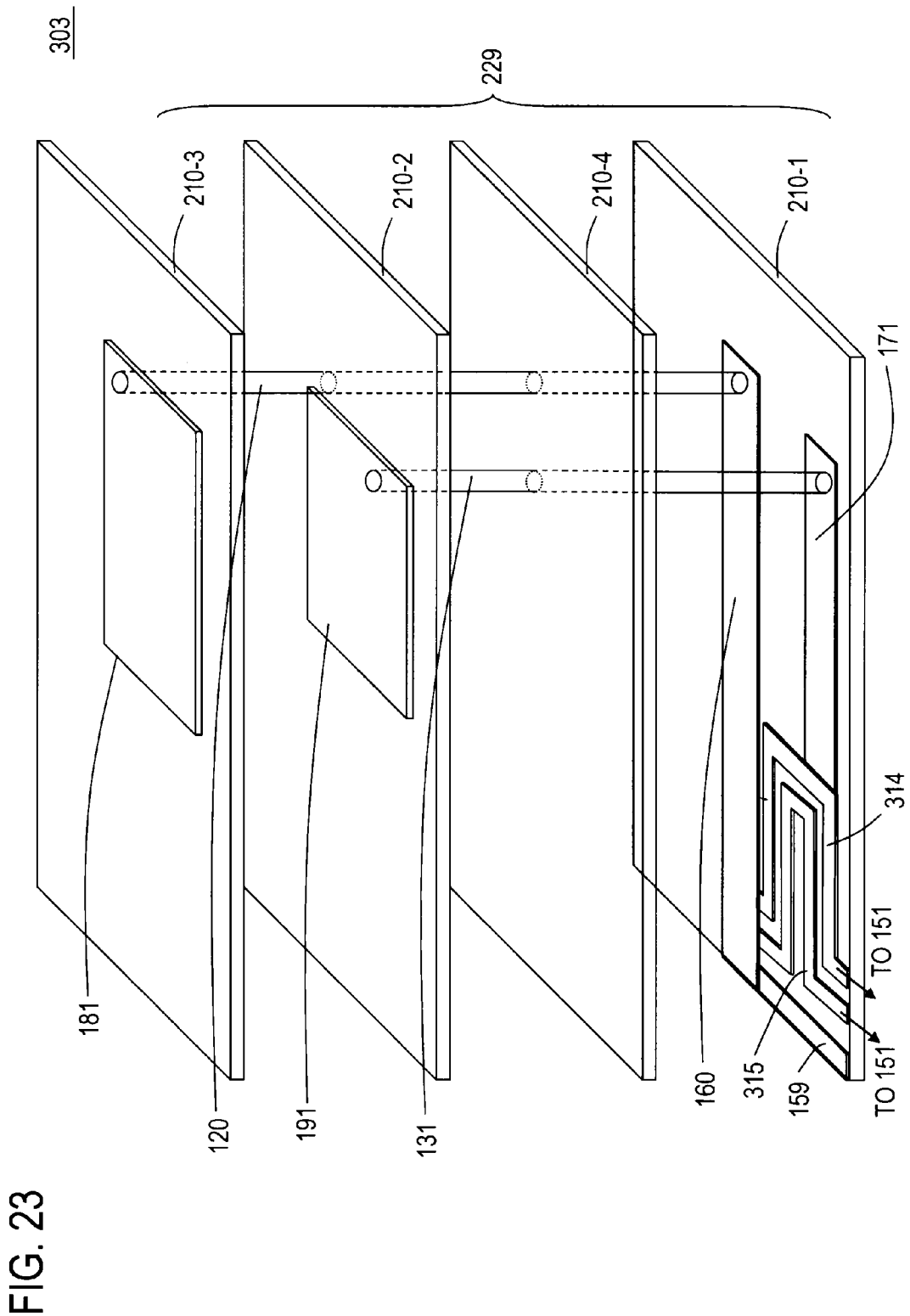
FIG. 23 is an exploded perspective view of a multiband resonator of a fourth variation of the second embodiment.

FIG. 23 is an exploded perspective view of a multiband resonator of a fourth variation of the second embodiment. The components are depicted as being transparent so that every component can be seen in FIG. 23. Furthermore, while a main through conductor 120 and a sub through conductor 131 are elongated in the exploded perspective view in FIG. 23 since dielectric layers are depicted as being separated, they have a length equal to the thickness of one or more dielectric layers in reality as illustrated in FIG. 1.

The multiband resonator 303 has a first short-circuit line conductor 314 that is narrower than that of the multiband resonator 300. Furthermore, a second short-circuit line conductor 315 is added. The second short-circuit line conductor 315 is formed along the first short-circuit line conductor 314 on the first dielectric layer 210-1 and electrically connects the one end of the main-line conductor 160 to a ground conductor 151. The rest of the configuration of the multiband resonator 303 is the same as that of the multiband resonator 300.

The first and second short-circuit line conductors 314 and 315 in FIG. 23 have a meander structure, which enables matching of the impedance of the multiband resonator to that of a device external to the multiband resonator. However, the first and second short-circuit line conductors 314 and 315 do not necessarily need to have a meander structure and may be otherwise designed as appropriate. The fourth variation can be combined with the first variation. The characteristics of the multiband resonator of the fourth variation can be more easily adjusted than in the second embodiment described above because the shapes and lengths of the short-circuit line conductors can be more readily changed. Furthermore, the multi-band resonator of the fourth variation is easier to manufacture than that of the second variation because a short-circuit through conductor is not required and accordingly less holes need to be provided in the dielectric layers. In addition, since the short-circuit line conductor is narrower, the multiband resonator 303 can be fabricated in smaller size than in the third variation.

Furthermore, as described with respect to the sixth and seventh variations of the first embodiment, a multiband-pass filter can be fabricated by providing multiple multiband resonators 303 as resonance parts 303 and using the input-output line conductor of any of the resonance parts 303 for input and the input-output line conductor of another one of the resonance parts 303 for output. In this case, all the resonance parts 303 are formed on the same dielectric substrate. In addition, a coupling conductor 146 for coupling the resonance parts 303 with each other may be provided. The coupling conductor 146 is formed on any of the dielectric layers on which none of the main-line conductor 160, the sub-line conductor 171, the sub open stub 191 and the main open stub 181 is formed.

[Simulations]

Figure 24B:
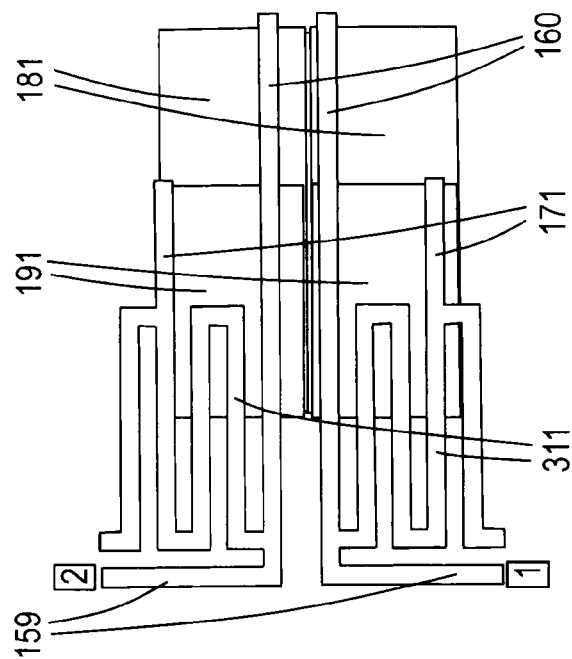
FIG. 24B is a diagram of the multiband-pass filter in the fourth simulation, viewed from below.
Figure 24A:
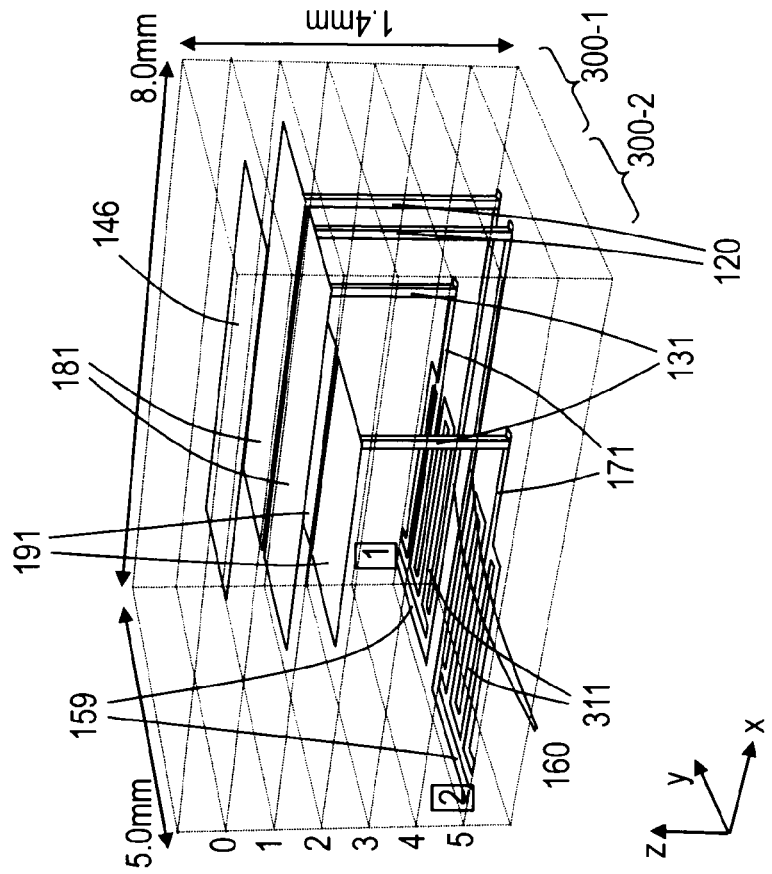
FIG. 24A is a bird's eye view illustrating a configuration of a multiband-pass filter in a fourth simulation.
Figure 25:
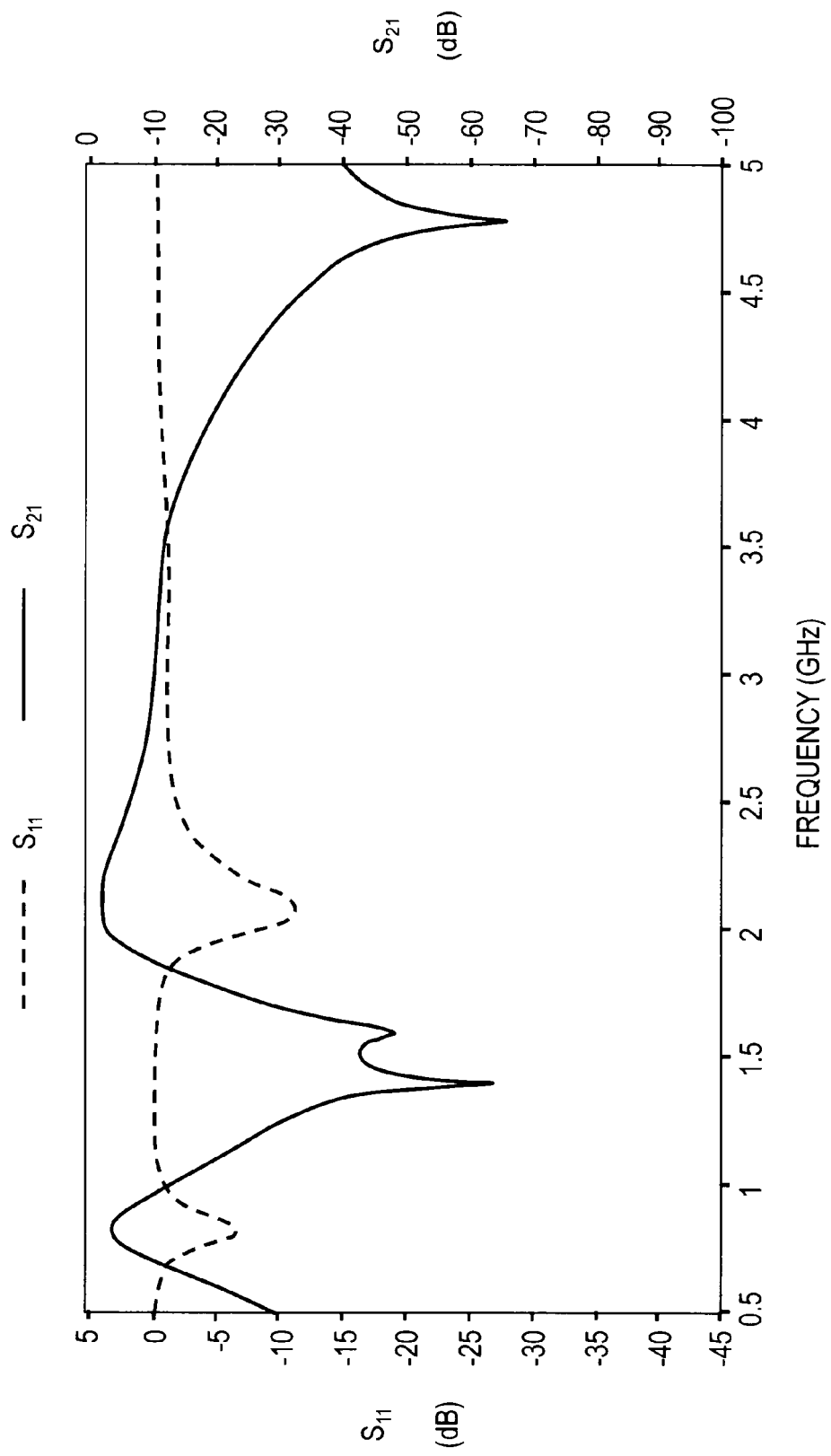
FIG. 25 is a graph illustrating results of the simulation of the frequency response of the multiband-pass filter illustrated in FIGS. 24A and 24B.

FIG. 24A is a bird's eye view illustrating a configuration of a multiband-pass filter in a fourth simulation. FIG. 24B is a diagram of the multiband-pass filter viewed from below. A dielectric substrate is represented by dotted lines. The multiband-pass filter is formed on the dielectric substrate including seven dielectric layers. Numbers 0 to 5 in FIG. 24A indicate the boundaries between the dielectric layers. The multiband-pass filter has a structure in which two multiband resonators 300 are arranged in parallel with each other as resonance parts. In order to enhance the coupling between the resonance parts, a coupling conductor 146 is provided. Specifically, the coupling conductor 146 is disposed at boundary 0, two main open stubs 181 are disposed at boundary 1, two sub open stubs 191 are disposed at boundary 2, and main-line conductors 160, sub-line conductors 171, first short-circuit line conductors 311, and input-output line conductors 159 are disposed at boundary 5. A ground conductor 151 is formed on the six surfaces of dielectric substrate so as to cover the entire dielectric substrate. The permittivity of the dielectric substrate is on the order of 10 and the thickness of each of the dielectric layers is approximately 200 μm. The line conductors have a line width of approximately 200 μm and the open stubs have a line width of approximately 2 mm. In the multiband-pass filter, a signal is input through an end labeled with the number 1 enclosed in a square in the figure and a signal is output through an end labeled with the number 2 enclosed in a square. FIG. 25 illustrates the results of the simulation of the frequency response of the multiband-pass filter illustrated in FIGS. 24A and 24B. The dashed curve represents reflectance loss ($S_{11}$) and the solid curve represents insertion loss ($S_{21}$). It can be seen from the graph that the insertion loss is nearly 3 dB and the reflectance loss is in the range of 7 to 10 dB around 1 GHz and 2 GHz.

Figure 26B:
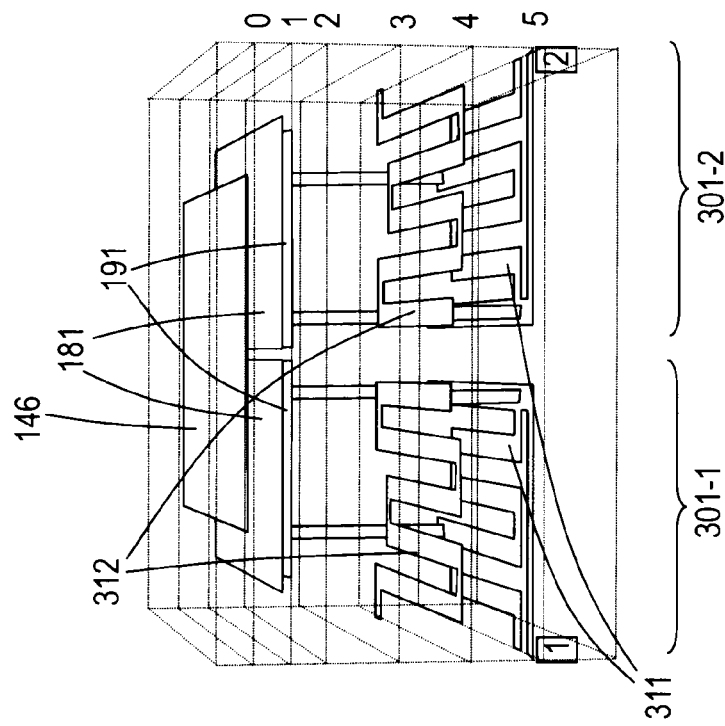
FIG. 26B is a bird's eye view illustrating the configuration of the multiband-pass filter in the fifth simulation, viewed from another angle.
Figure 26A:
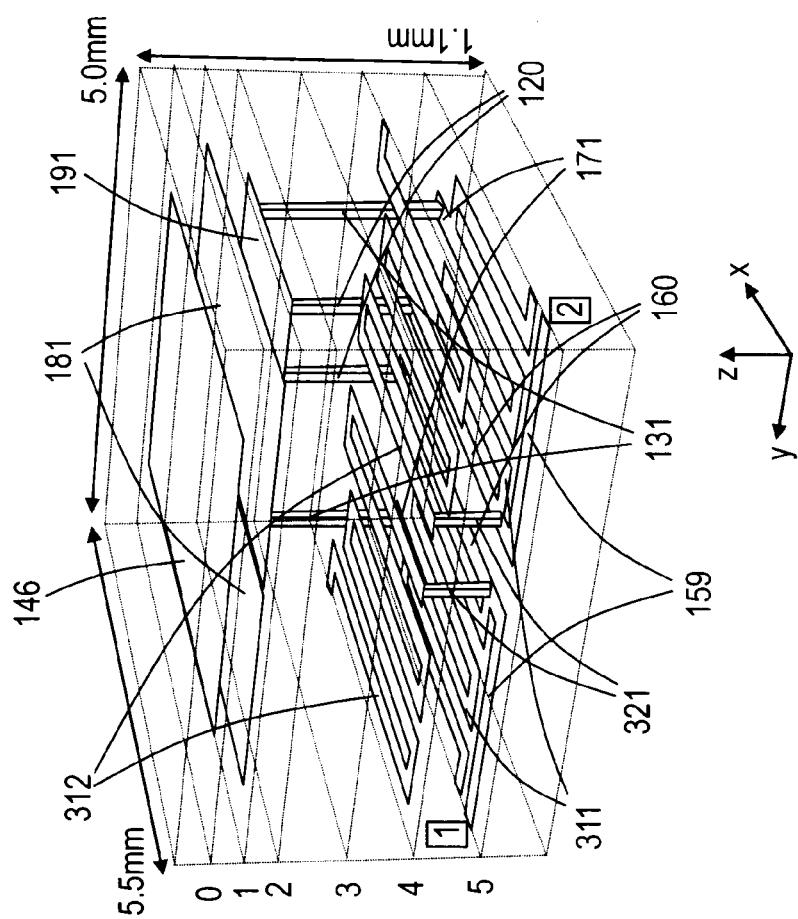
FIG. 26A is a bird's eye view illustrating a configuration of a multiband-pass filter in a fifth simulation.
Figure 27:
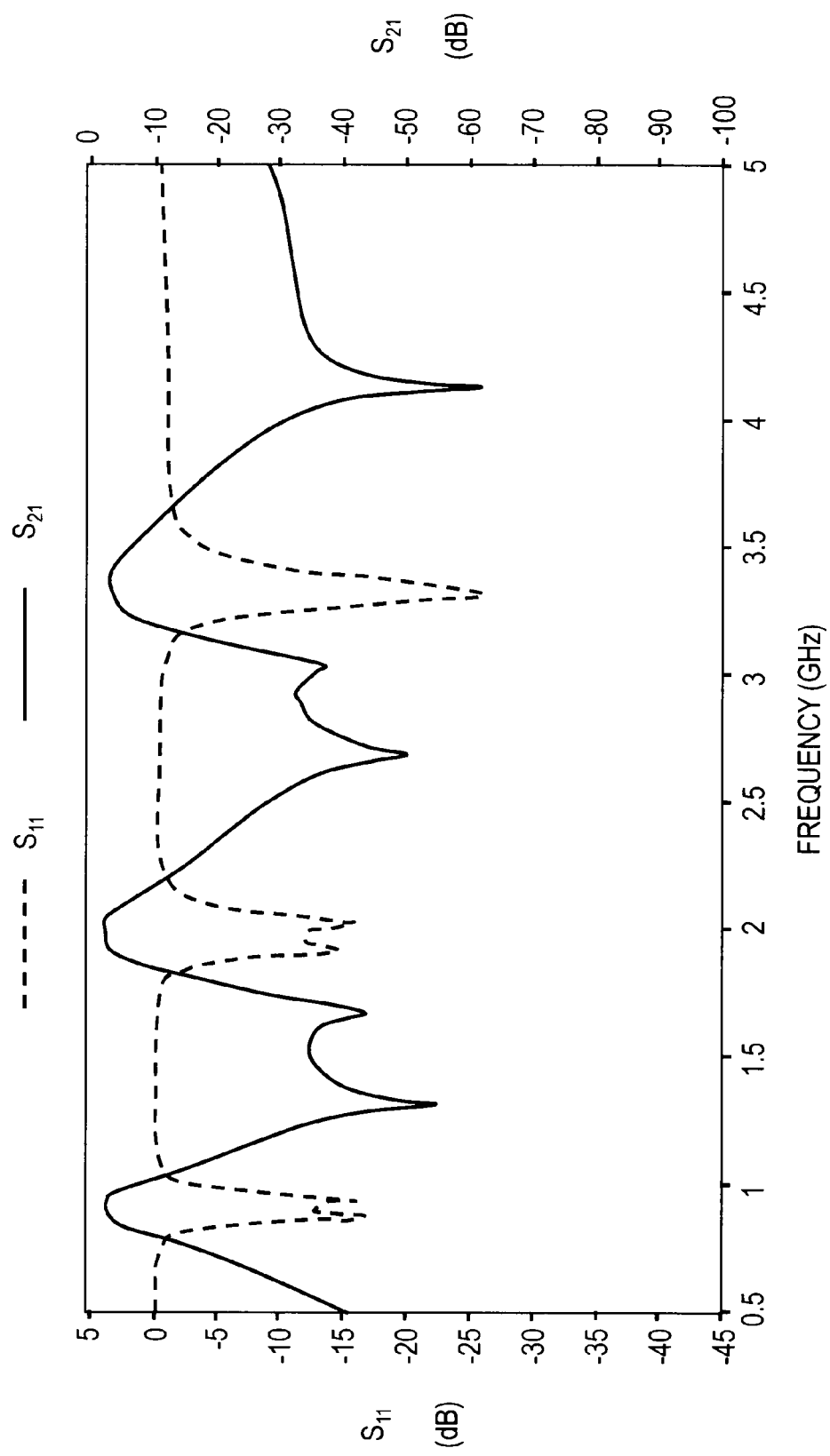
FIG. 27 is a graph illustrating results of a simulation of the frequency response of the multiband-pass filter illustrated in FIGS. 26A and 26B.

FIG. 26A is a bird's eye view illustrating a configuration of a multiband-pass filter in a fifth simulation. FIG. 26B is a bird's eye view of the multiband-pass filter viewed from another angle. A dielectric substrate is represented by dotted lines. The multiband-pass filter is formed on the dielectric substrate including seven dielectric layers. Numbers 0 to 5 in FIGS. 26A and 26B indicate the boundaries between the dielectric layers. The multiband-pass filter has a structure in which two multiband resonators 301 are arranged in parallel with each other as resonance parts. In order to enhance the coupling between the resonance parts, a coupling conductor 146 is provided. Specifically, the coupling conductor 146 is disposed at boundary 0, two main open stubs 181 are disposed at boundary 1, two sub open stubs 191 are disposed at boundary 2, second short-circuit line conductors 312 are disposed at boundary 4, and main-line conductors 160, sub-line conductors 171, first short-circuit line conductors 311, and input-output line conductors 159 are disposed at boundary 5. A ground conductor 151 is formed on the six surfaces of dielectric substrate so as to cover the entire dielectric substrate. The permittivity of the dielectric substrate is on the order of 10, the thickness of each of the upper three dielectric layers is approximately 100 µm, and the thickness of each of the lower four dielectric layers is approximately 200 µm. The line conductors have a line width of approximately 200 µm and the open stubs have a line width of approximately 2 mm. In the multiband-pass filter, a signal is input through an end labeled with the number 1 enclosed in a square in the figure and a signal is output through an end labeled with the number 2 enclosed in a square. FIG. 27 illustrates the results of the simulation of the frequency response of the multiband-pass filter illustrated in FIGS. 26A and 26B. It can be seen from the graph that the insertion loss is nearly 3 dB and the reflectance loss is 10 dB or greater around 1 GHz, 2 GHz and 3.3 GHz.

Figure 28:
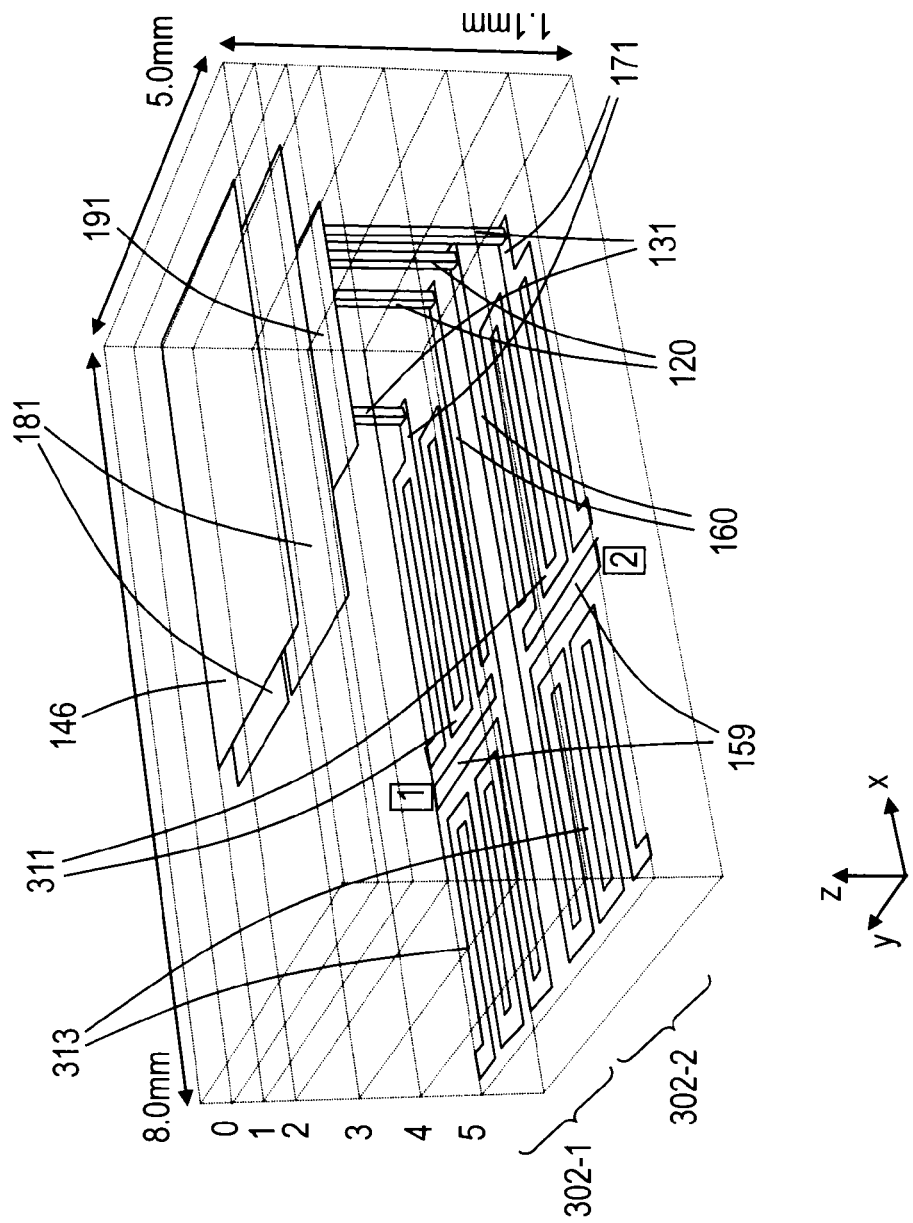
FIG. 28 is a bird's eye view illustrating a configuration of a multiband-pass filter in a sixth simulation.
Figure 29:
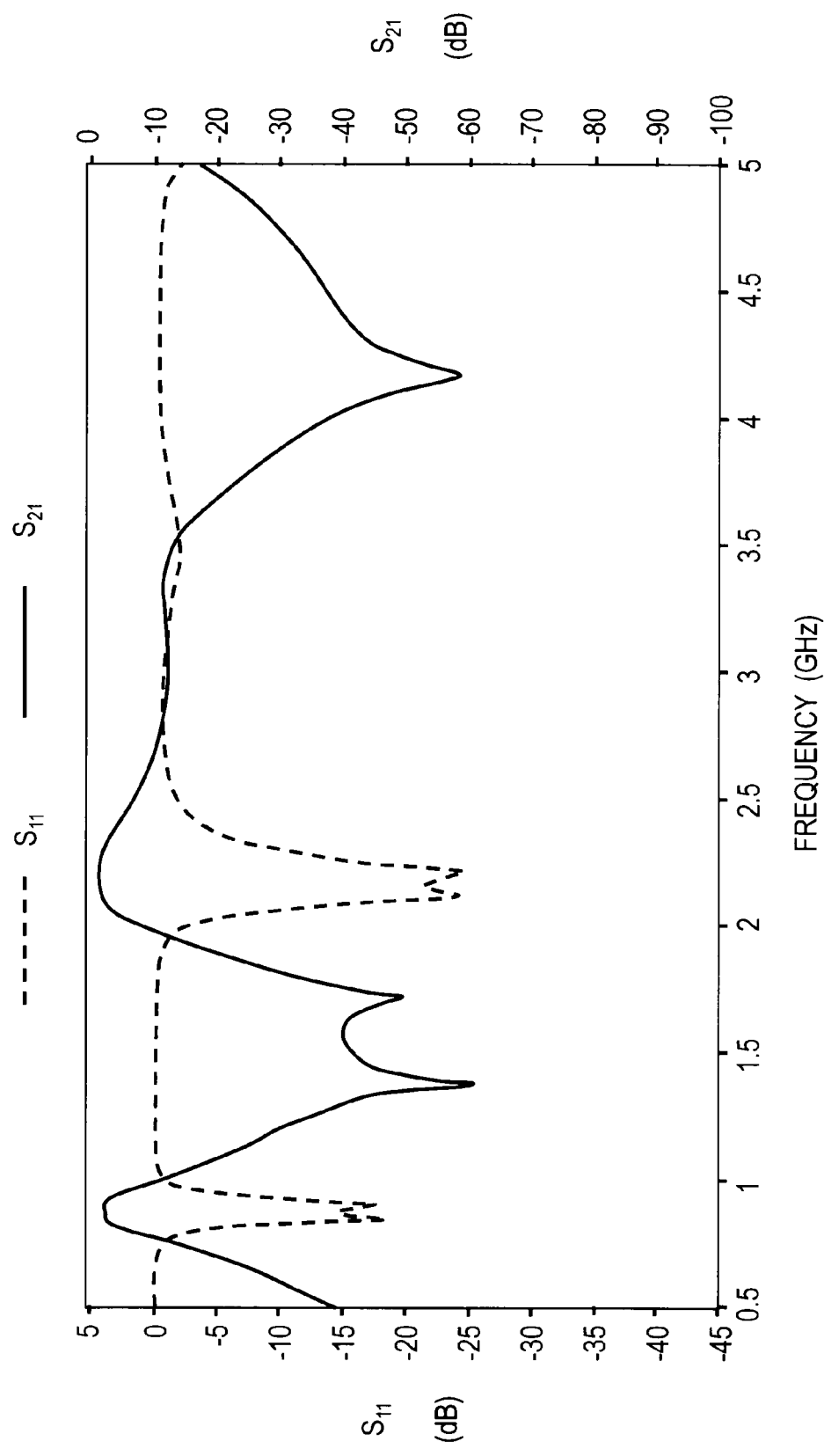
FIG. 29 is a graph illustrating results of a simulation of the frequency response of the multiband-pass filter illustrated in FIG. 28.

FIG. 28 is a bird's eye view illustrating a configuration of a multiband-pass filter in a sixth simulation. A dielectric substrate is represented by dotted lines. The multiband-pass filter is formed on the dielectric substrate including seven dielectric layers. Numbers 0 to 5 in FIG. 28 indicate the boundaries between the dielectric layers. The multiband-pass filter has a structure in which two multiband resonators 302 are arranged in parallel with each other as resonance parts. In order to enhance the coupling between the resonance parts, a coupling conductor 146 is provided. Specifically, the coupling conductor 146 is disposed at boundary 0, two main open stubs 181 are disposed at boundary 1, two sub open stubs 191 are disposed at boundary 2, and main-line conductors 160, sub-line conductors 171, first short-circuit line conductors 311, second short-circuit line conductors 313, and input-output line conductors 159 are disposed at boundary 5. A ground conductors 151 is formed on the six surfaces of dielectric substrate so as to cover the entire dielectric substrate. The permittivity of the dielectric substrate is on the order of 10, the thickness of each of the upper three dielectric layers is approximately 100 µm, and the thickness of each of the lower four dielectric layers is approximately 200 µm. The line conductors have a line width of approximately 200 µm and the open stubs have a line width of approximately 2 mm. In the multiband-pass filter, a signal is input through an end labeled with the number 1 enclosed in a square in the figure and a signal is output through an end labeled with the number 2 enclosed in a square. FIG. 29 illustrates the results of the simulation of the frequency response of the multiband-pass filter illustrated in FIG. 28. It can be seen from the graph that the insertion loss is nearly 3 dB and the reflectance loss is 15 dB or greater around 1 GHz and 2 GHz.

Figure 30B:
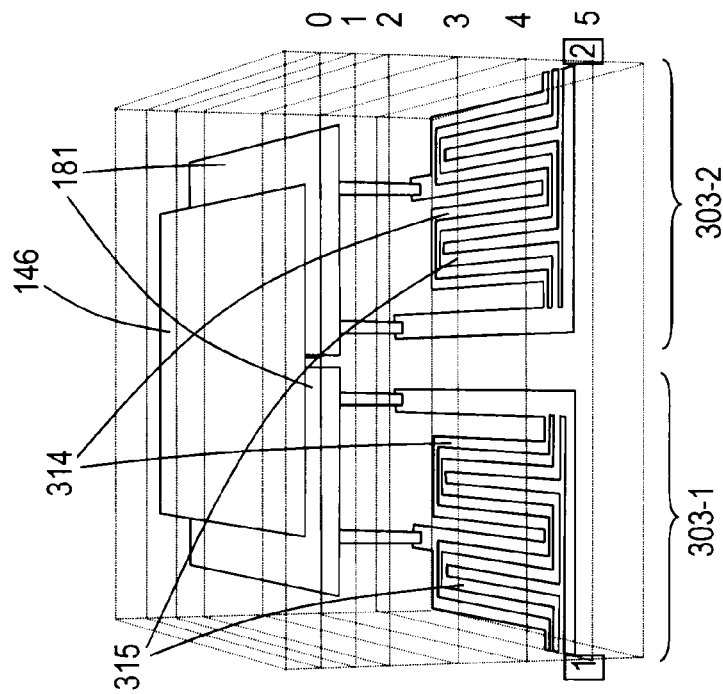
FIG. 30B is a bird's eye view illustrating the configuration of the multiband-pass filter in the seventh simulation, viewed from another angle.
Figure 30A:
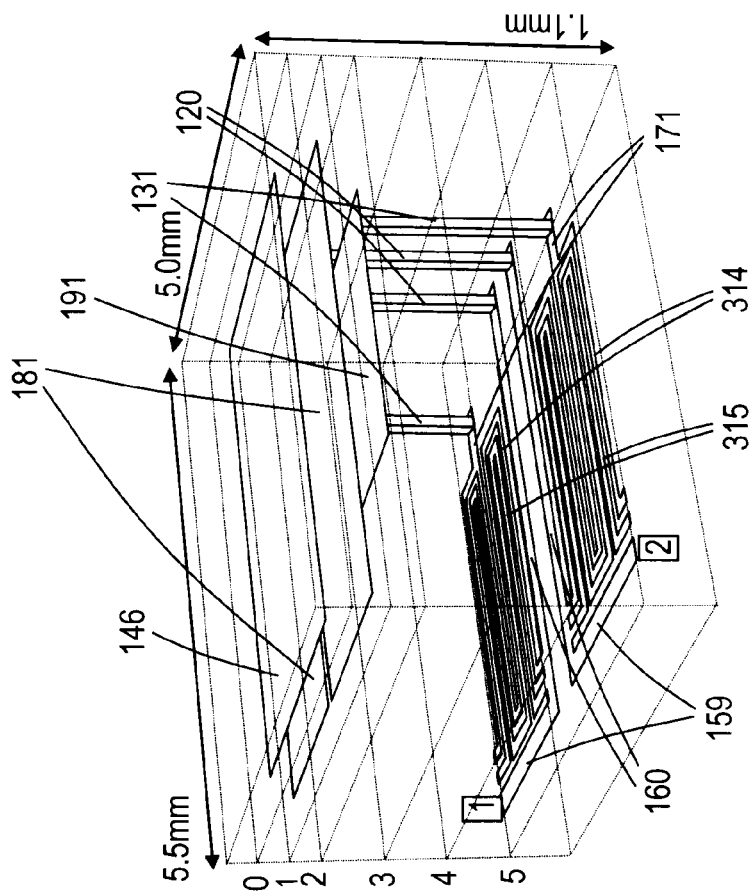
FIG. 30A is a bird's eye view illustrating a configuration of a multiband-pass filter in a seventh simulation.
Figure 31:
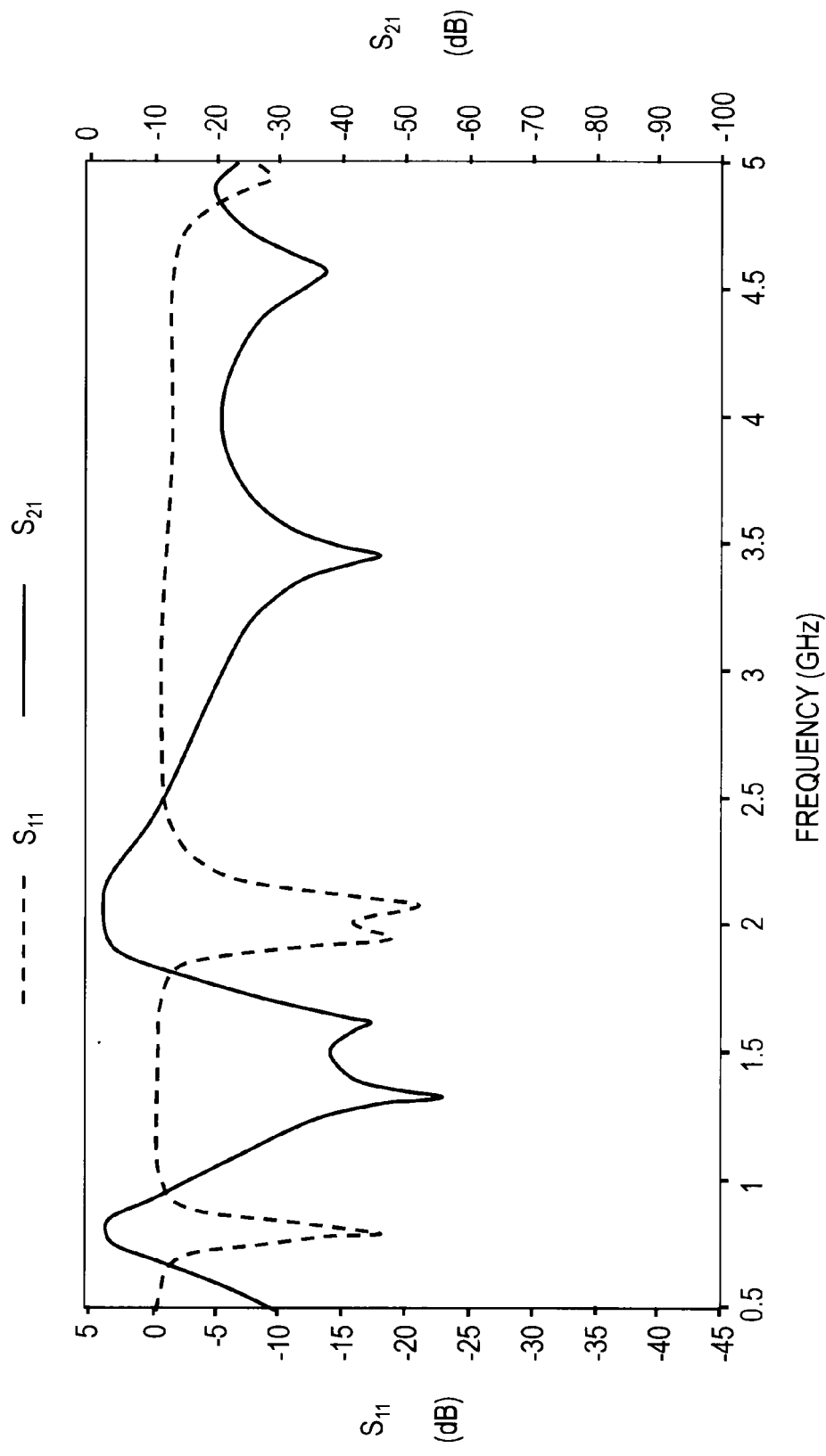
FIG. 31 is a graph illustrating results of a simulation of the frequency response of the multiband-pass filter illustrated in FIGS. 30A and 30B.

FIG. 30A is a bird's eye view illustrating a configuration of a multiband-pass filter in a seventh simulation. FIG. 30B is a bird's eye view of the multiband-pass filter viewed from another angle. A dielectric substrate is represented by dotted lines. The multiband-pass filter is formed on the dielectric substrate including seven dielectric layers. Numbers 0 to 5 in FIGS. 30A and 30B indicate the boundaries between the dielectric layers. The multiband-pass filter has a structure in which two multiband resonators 303 are arranged in parallel with each other as resonance parts. In order to enhance the coupling between the resonance parts, a coupling conductor 146 is provided. Specifically, the coupling conductor 146 is disposed at boundary 0, two main open stubs 181 are disposed at boundary 1, two sub open stubs 191 are disposed at boundary 2, and main-line conductors 160, sub-line conductors 171, first short-circuit line conductors 314, second short-circuit line conductors 315, and input-output line conductors 159 are disposed at boundary 5. A ground conductor 151 is formed on the six surfaces of dielectric substrate so as to cover the entire dielectric substrate. The permittivity of the dielectric substrate is on the order of 10, the thickness of each of the upper three dielectric layers is approximately 100 µm, and the thickness of each of the lower four dielectric layers is approximately 200 µm. The main- and sub-line conductors have a line width of approximately 200 µm, the open stubs have a line width of approximately 2 mm, and the short-circuit line conductors have a line width of approximately 100 µm. In the multiband-pass filter, a signal is input through an end labeled with the number 1 enclosed in a square in the figure and a signal is output through an end labeled with the number 2 enclosed in a square. FIG. 31 illustrates the results of the simulation of the frequency response of the multiband-pass filter illustrated in FIGS. 30A and 30B. It can be seen from the graph that the insertion loss is nearly 3 dB and the reflectance loss is 15 dB or greater around 1 GHz and 2 GHz.

[General Concept]

In conclusion, a general concept of the present invention will be described with regard to features common to the first and second embodiments. Both of the multiband resonator 100 and the multiband resonator 300 includes a dielectric substrate, a ground conductor, a main-line conductor, a sub-line conductor, a sub open stub, a main open stub, a short-circuit conductor, a main through conductor, and a sub through conductor. The dielectric substrate includes three or more dielectric layers. The ground conductor may be formed on any of the dielectric layers or may be formed so as to cover the entire dielectric substrate. The main-line conductor and the sub-line conductor are formed on any of the dielectric layers. The sub open stub is formed on a dielectric layer on which neither of the main-line conductor and the sub-line conductor is formed. The main open stub is formed on a dielectric layer on which none of the main-line conductor, the sub-line conductor, and the sub open stub is formed. The short-circuit conductor electrically connects one end of the main-line conductor to one end of the sub-line conductor and to the ground conductor. The main through conductor electrically connects the other end of the main-line conductor to one end of the main open stub that is aligned with that other end of the main-line conductor. The sub through conductor electrically connects the other end of the sub-line conductor to one end of the sub open stub that is aligned with that other end of the sub-line conductor.

Differences between the multiband resonator 100 and the multiband resonator 300 are described below. In the multiband resonator 100, the main-line conductor and the sub-line conductor are formed on different dielectric substrates. The dielectric substrate of the multiband resonator 100 includes at least first to fourth dielectric layers. A master through conductor is used as the short-circuit conductor. The master through conductor passes through a number of dielectric layers to electrically connects one end of the main-line conductor to one end of the sub-line conductor that is aligned with that end of the main-line conductor, and to the ground conductor. In the multiband resonator 300, in contrast, the main-line conductor and the sub-line conductor are formed on the same dielectric layer. The dielectric substrate includes at least first to third dielectric layers. A first short-circuit line conductor is used as the short-circuit conductor. The first short-circuit line conductor is formed on the dielectric layer on which the main-line conductor and the sub-line conductor are formed, and electrically connects one end of the main-line conductor to one end of the sub-line conductor and to the ground conductor. A multiband-pass filter can be fabricated by providing multiple multiband resonators according to the general concept described above as resonance parts and also providing an input-output line conductor for input and an input-output line conductor for output.

INDUSTRIAL APPLICABILITY

The present invention can be applied to multiband-pass filters in the communication filed and other fields.

What is claimed is:

1. A multiband-pass filter including multiple resonators formed on a dielectric substrate comprising three or more dielectric layers, the multiband-pass filter comprising:
    a ground conductor;
    wherein, each of the resonators comprises:
        a main-line conductor and a sub-line conductor formed on any of the dielectric layers;
        a sub open stub formed on a dielectric layer on which neither of the main-line conductor and the sub-line conductor is formed;
        a main open stub formed on a dielectric layer on which none of the main-line conductor, the sub-line conductor and the sub open stub is formed;
        a short-circuit conductor electrically connecting one end of the main-line conductor to one end of the sub-line conductor and to the ground conductor;
        a main through conductor electrically connecting the other end of the main-line conductor to one end of the main open stub, the end of the main open stub being aligned with that other end of the main-line conductor; and
        a sub through conductor electrically connecting the other end of the sub-line conductor to one end of the sub open stub, the end of the sub open stub being aligned with that other end of the sub-line conductor;
    any two of the resonators comprising an input-output line conductor connected to the main-line conductor.

2. The multiband-pass filter according to claim 1, wherein:
    the dielectric substrate further comprises a dielectric layer on which none of the main-line conductor, the sub-line conductor, the sub open stub, and the main open stub is formed; and
    the multiband-pass filter further comprises a coupling conductor for coupling the resonators with each other, the coupling conductor being formed on any of the dielectric layers on which none of the main-line conductor, the sub-line conductor, the sub open stub and the main open stub is formed.

3. A multiband resonator comprising:
    a dielectric substrate comprising at least first to fourth dielectric layers;
    a ground conductor;
    a main-line conductor formed on the first dielectric layer;
    a sub-line conductor formed on the second dielectric layer;
    a sub open stub formed on the third dielectric layer;
    a main open stub formed on the fourth dielectric layer;
    a master through conductor electrically connecting one end of the main-line conductor to one end of the sub-line conductor and to the ground conductor, the one end of the sub-line conductor being aligned with the one end of the main-line conductor;
    a main through conductor electrically connecting the other end of the main-line conductor to one end of the main open stub, the one end of the main open stub being aligned with that other end of the main-line conductor;
    a sub through conductor electrically connecting the other end of the sub-line conductor to one end of the sub open stub, the one end of the sub open stub being aligned with that other end of the sub-line conductor;
    a main switch formed at the one end of the main-line conductor and electrically disconnecting the main-line conductor from the master through conductor; and
    a sub switch formed at the one end of the sub-line conductor and electrically disconnecting the sub-line conductor from the master through conductor.

4. A multiband resonator comprising:
    a dielectric substrate comprising at least first to sixth dielectric layers:
    a ground conductor;
    a main-line conductor formed on the first dielectric layer;
    a sub-line conductor formed on the second dielectric layer;
    a sub open stub formed on the third dielectric layer;
    a main open stub formed on the fourth dielectric layer;
    a second sub-line conductor formed on the fifth dielectric layer;
    a second sub open stub formed on the sixth dielectric layer;
    a master through conductor;
    a main through conductor;
    a sub through conductor; and
    a second sub through conductor;
    the first, second, fifth, sixth, third and fourth dielectric layers being disposed in this order;
    the master through conductor electrically connecting one end of the main-line conductor to one end of the sub-line conductor and to the ground conductor, the one end of the sub-line conductor being aligned with the one end of the main-line conductor;
    the master through conductor electrically connecting the one end of the main-line conductor to one end of the second sub-line conductor, the one end of the second sub-line conductor being aligned with the one end of the main-line conductor;
    the main through conductor electrically connecting the other end of the main-line conductor to one end of the main open stub, the one end of the main open stub being aligned with that other end of the main-line conductor;
    the sub through conductor electrically connecting the other end of the sub-line conductor to one end of the sub open stub, the one end of the sub open stub being aligned with that other end of the sub-line conductor; and
    the second sub through conductor electrically connecting the other end of the second sub-line conductor to one end of the second sub open stub, the one end of the second sub open stub being aligned with that other end of the second sub-line conductor.

* * * * *